(12) United States Patent
Jang et al.

(10) Patent No.: US 12,334,578 B2
(45) Date of Patent: Jun. 17, 2025

(54) ELECTRONIC DEVICE INCLUDING BATTERY

(71) Applicant: Samsung Electronics Co., Ltd., Suwon-si (KR)

(72) Inventors: Kiyoun Jang, Suwon-si (KR); Sukhyun Lee, Suwon-si (KR); Sunjin Kim, Suwon-si (KR); Yongsub Jeon, Suwon-si (KR); Chihyun Cho, Suwon-si (KR); Jaeman Choi, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 151 days.

(21) Appl. No.: 17/835,364

(22) Filed: Jun. 8, 2022

(65) Prior Publication Data

US 2022/0302545 A1 Sep. 22, 2022

Related U.S. Application Data

(63) Continuation of application No. PCT/KR2022/001540, filed on Jan. 28, 2022.

(30) Foreign Application Priority Data

Jan. 29, 2021 (KR) ........................ 10-2021-0013327

(51) Int. Cl.
*H05K 5/00* (2025.01)
*H01M 50/102* (2021.01)
(Continued)

(52) U.S. Cl.
CPC ....... *H01M 50/247* (2021.01); *H01M 50/102* (2021.01); *H05K 5/0086* (2013.01);
(Continued)

(58) Field of Classification Search
CPC ........................................................ H05K 5/00
See application file for complete search history.

(56) References Cited

U.S. PATENT DOCUMENTS 9,502,734 B1 * 11/2016 Lim ........................ H01M 4/02
2016/0329546 A1 * 11/2016 Ham ................... H01M 50/533
(Continued)

FOREIGN PATENT DOCUMENTS

JP 2017-033932 A 2/2017
KR 10-2000-0032030 A 6/2000
(Continued)

*Primary Examiner* — Jerry Wu
(74) *Attorney, Agent, or Firm* — Jefferson IP Law, LLP

(57) ABSTRACT

An electronic device including a battery is provided. The battery disposed inside the electronic device includes a battery cell including a plurality of cell areas arranged at intervals therebetween and one or more folding areas that foldably connect a pair of neighboring cell areas, and a protection circuit portion extending from the battery cell and electrically connected to a printed circuit board (PCB) of the electronic device. The battery cell includes a plurality of substrate members stacked while being insulated through a separation membrane and a mixture layer applied to a surface of each of the substrate member, in which the substrate member are arranged without an overlapping area therebetween in a folding area.

5 Claims, 24 Drawing Sheets

(51) Int. Cl.
 *H01M 50/247* (2021.01)
 *H05K 5/02* (2006.01)
(52) U.S. Cl.
 CPC ....... *H05K 5/0226* (2013.01); *H01M 2220/30* (2013.01); *H05K 5/0017* (2013.01)

(56) References Cited

U.S. PATENT DOCUMENTS

2020/0106068 A1\* 4/2020 Kang ................. H01M 50/434
2021/0020993 A1 1/2021 Jun

FOREIGN PATENT DOCUMENTS

| KR | 10-2013-0133332 A | 12/2013 |
| KR | 10-1515778 B1 | 5/2015 |
| KR | 10-2015-0128063 A | 11/2015 |
| KR | 10-1675950 B1 | 11/2016 |
| KR | 10-2016-0148404 A | 12/2016 |
| KR | 10-2017-0033513 A | 3/2017 |
| KR | 10-2048822 B1 | 11/2019 |
| KR | 10-2020-0074741 A | 6/2020 |
| KR | 10-2020-0113737 A | 10/2020 |

\* cited by examiner

ELECTRONIC DEVICE INCLUDING BATTERY

CROSS-REFERENCE TO RELATED APPLICATIONS

This application is a continuation application, claiming priority under § 365(c), of an International application No. PCT/KR2022/001540, filed on Jan. 28, 2022, which is based on and claims the benefit of a Korean patent application number 10-2021-0013327, filed on Jan. 29, 2021, in the Korean Intellectual Property Office, the disclosure of which is incorporated by reference herein in its entirety.

BACKGROUND

1. Field

The disclosure relates to an electronic device including a battery.

2. Description of Related Art

A portable electronic device includes an embedded battery and may be driven using power supplied from the battery. The electronic device is being transformed from a uniform rectangular shape to a shape including various designs and functions to satisfy consumers' purchasing desires. For example, a foldable electronic device that may be transformed in size according to a state of use is under development, and thus a form of a battery that may be embedded in such an electronic device is also under development.

The above information is presented as background information only to assist with an understanding of the disclosure. No determination has been made, and no assertion is made, as to whether any of the above might be applicable as prior art with regard to the disclosure.

SUMMARY

A foldable electronic device may include a battery having a folding area that is folded in response to a folding operation, and a substrate that forms an electrode of the battery may be formed of a metal material. The folding area of the battery may be repeatedly folded tens of thousands of times or more in the process of using the electronic device, and the substrate disposed in the folding area may experience a fatigue failure due to the repeated folding operation. When the substrate forming the electrode is damaged, the battery may lose its functions.

An aspect of the disclosure is to provide an electronic device including a foldable battery.

Another aspect of the disclosure is to improve durability against a bending operation of a folding area of a battery.

Another aspect of the disclosure is to reduce the thickness of a folding area of a battery and improve flexibility, and reduce stress generated due to a folding operation accordingly.

In accordance with an aspect of the disclosure, an electronic device is provided. The electronic device includes a display including a first area and a second area, a first housing connected to a rear surface of the first area and forming a first space, a second housing connected to a rear surface of the second area and forming a second space, a hinge structure configured to foldably connect the first housing and the second housing and allow the first area and the second area to be in a first state in which the first area and the second area form the same plane or a second state in which the first area and the second area face each other, and a battery cell including a first cell area disposed in the first space, a second cell area disposed in the second space, and a folding area that foldably connects the first cell area and the second cell area. The battery cell may include a plurality of substrate members having a longitudinal direction extending from the first cell area to the second cell area through the folding area and stacked while being insulated through a separation membrane in the first cell area and the second cell area, and a mixture layer applied to a surface of each of the substrate member in the first cell area and the second cell area. The folding area may include a non-overlap stacked structure that prevents contact between substrate member forming opposite electrodes among the substrate member.

In accordance with another aspect of the disclosure, a battery in an electronic device is provided. The battery includes a battery cell including a plurality of cell areas arranged at intervals therebetween and one or more folding areas that foldably connect a pair of neighboring cell areas to each other, and a protection circuit portion extending from the battery cell and electrically connected to a printed circuit board (PCB) of the electronic device. The battery cell may include a plurality of substrate members having a longitudinal direction extending along the cell areas with the folding areas therebetween and stacked while being insulated through a separation membrane in the cell areas, and a mixture layer applied to a surface of each of the substrate member. The folding area may include a stacked structure in which the mixture layer is omitted and there is no substantial overlapping area between the substrate member.

According to various embodiments described herein, by omitting an active material from a surface of an electrode substrate disposed in a folding area of a battery and disposing substrates forming a negative electrode and a positive electrode not to overlap each other, the thickness may be reduced, and flexibility may thus be improved. In addition, by disposing a reinforcing member on a surface of the electrode substrate disposed in the folding area, durability against repeated bending may be improved.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
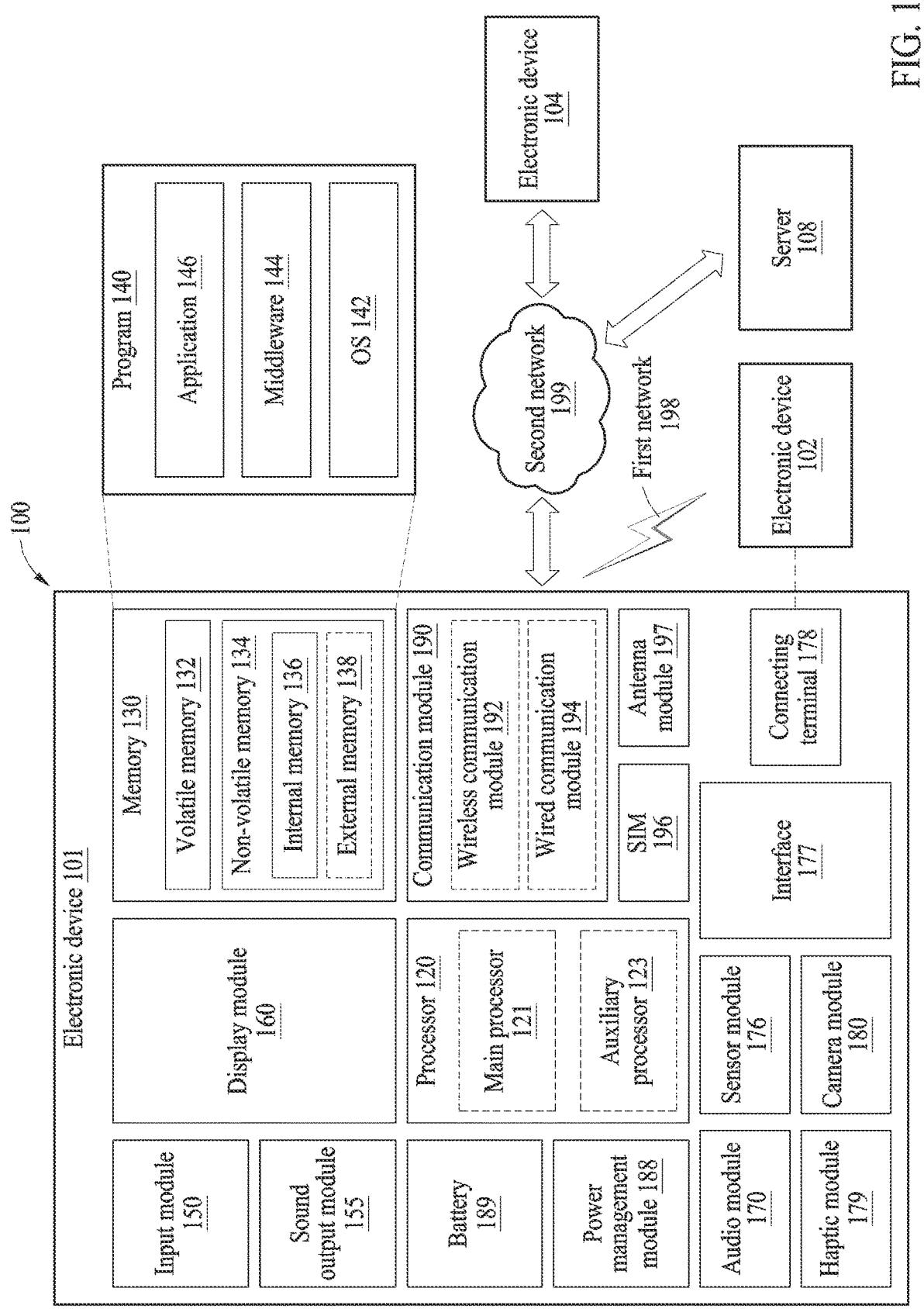
FIG. 1 is a block diagram illustrating an example electronic device in a network environment according to an embodiment of the disclosure.

Hereinafter, various example embodiments will be described in greater detail with reference to the accompanying drawings. When describing the example embodiments with reference to the accompanying drawings, like reference numerals refer to like elements and a repeated description related thereto will be omitted.

Referring to FIG. 1, an electronic device 101 in a network environment 100 may communicate with an electronic device 102 via a first network 198 (e.g., a short-range wireless communication network), or communicate with at least one of an electronic device 104 and a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various data used by at least one component (e.g., the processor 120 or the sensor module 176) of the electronic device 101. The data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing records. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., the electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with an external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more communication processors that are operable independently of the processor 120 (e.g., an AP) and that support direct (e.g., wired) communication or wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. According to an example embodiment, the antenna module 197 may include an antenna including a radiating element including a conductive material or a conductive pattern formed in or on a substrate (e.g., PCB). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general-purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and server 108. For example, if the electronic device 101 needs to perform a function or a service automatically, or in response to a request from a user or another device, the electronic device 101, instead of, or in addition to, executing the function or the service, may request one or more external electronic devices to perform at least a part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least a part of a reply to the request. To that end, a cloud computing, distributed computing, mobile edge computing (MEC), or client-server computing technology may be used, for example. The electronic device 101 may provide ultra-low latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

According to various example embodiments, an electronic device may be a device of one of various types. The electronic device may include, as non-limiting examples, a portable communication device (e.g., a smartphone, etc.), a computing device, a portable multimedia device, a portable medical device, a camera, a wearable device, or a home appliance. However, the electronic device is not limited to the foregoing examples.

It should be construed that various example embodiments of the disclosure and the terms used therein are not intended to limit the technological features set forth herein to some particular embodiments but include various changes, equivalents, or replacements of the example embodiments. In connection with the description of the drawings, like reference numerals may be used for similar or related components. It should be understood that a singular form of a noun corresponding to an item may include one or more of the things, unless the relevant context clearly indicates otherwise. As used herein, "A or B," "at least one of A and B," "at least one of A or B," "A, B, or C," "at least one of A, B, and C," and "A, B, or C," each of which may include any one of the items listed together in the corresponding one of the phrases, or all possible combinations thereof. Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the disclosure. It should also be understood that, when a component (e.g., a first component) is referred to as being "connected to" or "coupled to" another component with or without the term "functionally" or "communicatively," the component can be connected or coupled to the other component directly (e.g., wiredly), wirelessly, or via a third component.

As used in connection with various example embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in the form of an application-specific integrated circuit (ASIC).

Various example embodiments set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to various example embodiments, a method according to an example embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components or operations may be omitted, or one or more other components or operations may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
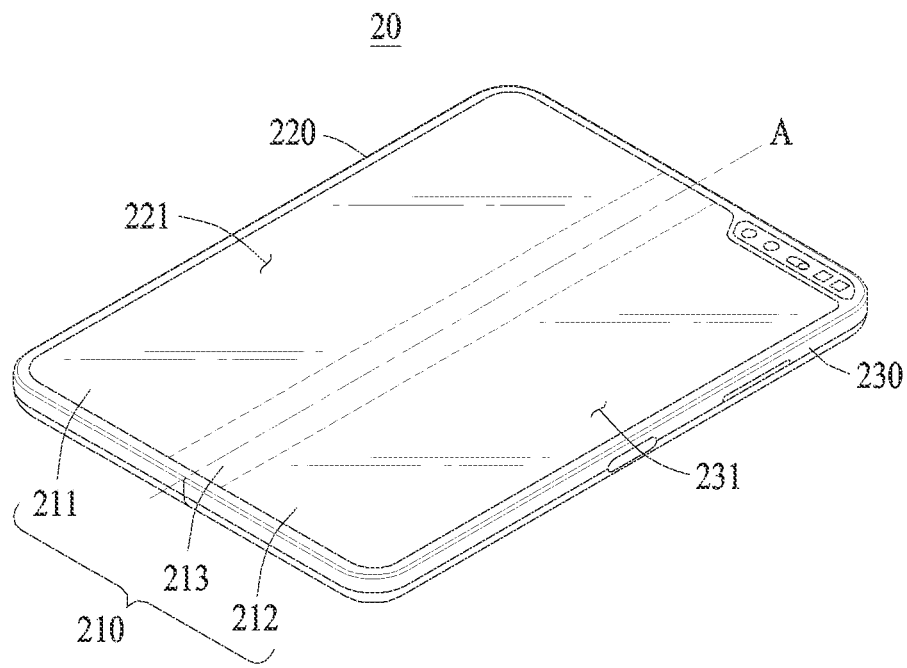
FIGS. 2A and 2B are perspective views of an example state of use of an electrode device according to various embodiments of the disclosure.
Figure 2B:
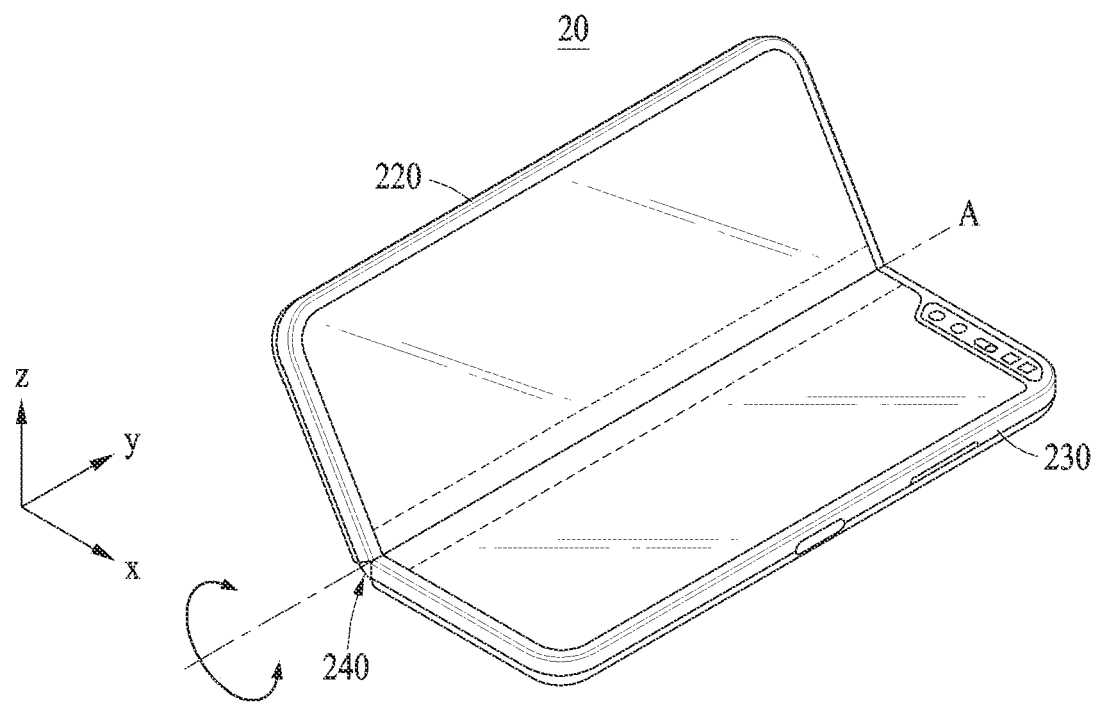
Figure 3:
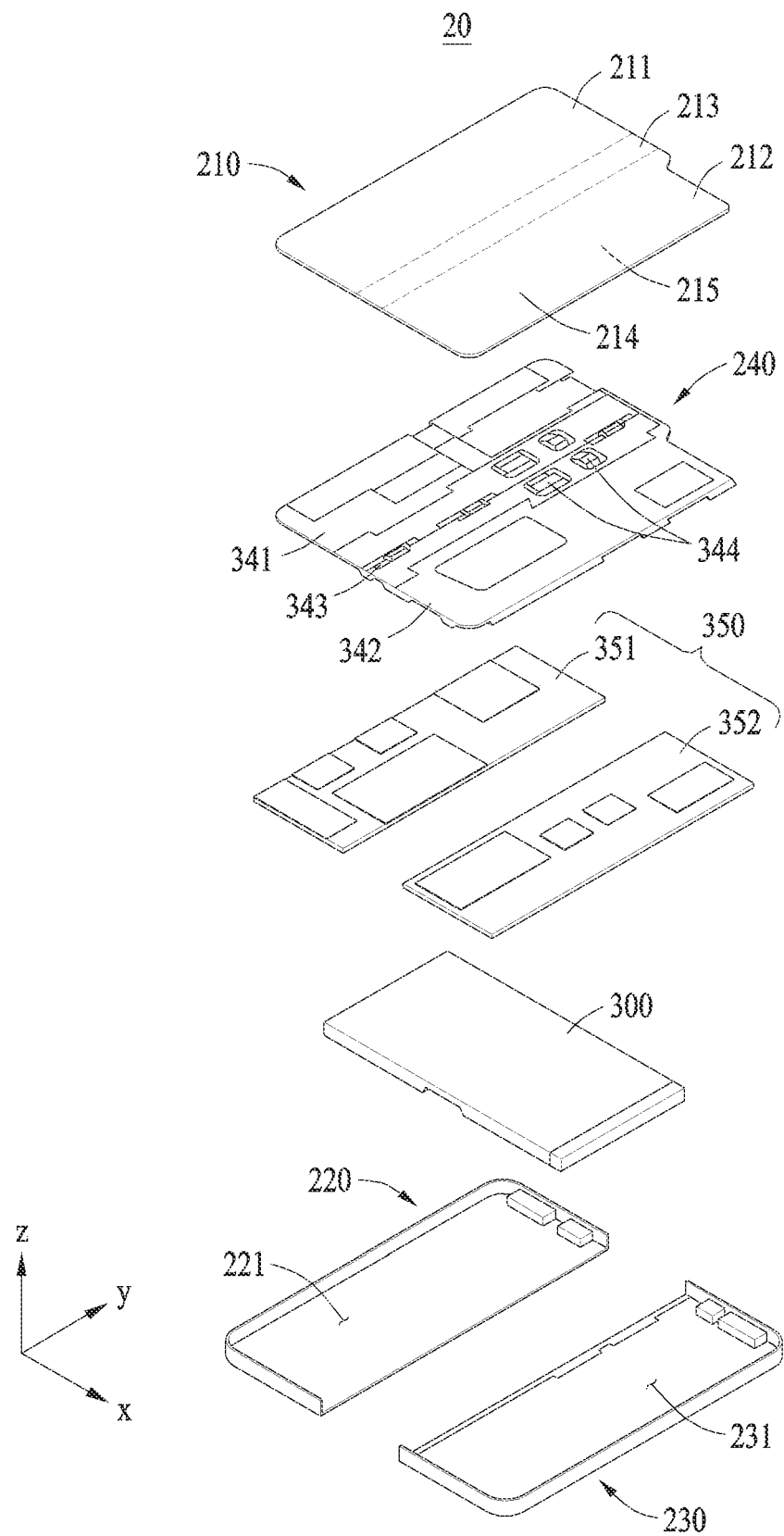
FIG. 3 is an exploded perspective view of an electrode device according to an embodiment of the disclosure.

FIG. 2A is a perspective view of an example state of use of an electrode device according to an embodiment of the disclosure, FIG. 2B is a perspective view of an example state of use of an electrode device according to an embodiment of the disclosure, and FIG. 3 is an exploded perspective view of an electrode device according to an embodiment of the disclosure.

Referring to FIGS. 2A 2B, and 3, according to various embodiments, an electronic device 20 (e.g., the electronic device 101 of FIG. 1) may be changed in shape according to a state of use. For example, the electronic device 20 may be provided in a foldable type that may be selectively folded or unfolded according to the state of use. The electronic device 20 may include a display 210 (e.g., the display module 160 of FIG. 1), a first housing 220, a second housing 230, a support assembly 240, a PCB 350, and a battery 300 (e.g., the battery 189 of FIG. 1). A surface on which the display 210 is disposed may be defined as a front surface of the electronic device 20, and a surface opposite to the front surface may be defined as a rear surface of the electronic device 20. A surface surrounding a space between the front surface and the rear surface may be defined as a side surface of the electronic device 20.

The display 210 (e.g., the display module 160 of FIG. 1) may display visual information (e.g., a text, a video, and/or an image) to a user. At least a portion of the display 210 may be deformed to a flat surface or a curved surface such that the display 210 may be changed in shape in response to a shape change (e.g., an opening/closing operation of FIGS. 2A and 2B) of the electronic device 20. The display 210 may include an axis area 213 in which a folding axis A is disposed, a first area 211 disposed on one side (e.g., a left area of the front surface) from the axis area 213, and a second area 212 disposed on the other side (e.g., a right area of the front surface) from the axis area 213. An overall shape of the display 210 may be changed in response to the opening and/or closing operation of the electronic device 20 as an angle formed between the first area 211 and the second area 212 is adjusted through the axis area 213. For example, the display 210 may be changed in shape to be in a first state (e.g., an unfolded state illustrated in FIG. 2A) in which the first area 211 and the second area 212 form substantially the same plane, an intermediate state (e.g., a state illustrated in FIG. 2B) in which the first area 211 and the second area 212 form a predetermined angle, or a second state (e.g., a folded state illustrated in FIG. 4B) in which the first area 211 and the second area 212 face each other.

The first area 211 and the second area 212 may be symmetrical on the whole with respect to the axis area 213. However, since the first area 211 or the second area 212 include a notch area that is partially cut by another component (e.g., a camera, a sensor, etc.) exposed on the front surface of the electronic device 20, a portion thereof may be asymmetrical.

This areal division of the display 210 described above may be provided as an example, and the display 210 may be divided into a plurality of areas according to functions and structures required for the electronic device 20. For example, although the areas of the display 210 are illustrated in FIGS. 2A and 2B as being divided based on the folding axis A or a central area parallel to a y-axis, the areas of the display 210 may be divided based on another folding axis A (e.g., a folding axis A parallel to an x axis) or another folding area B (e.g., a folding area B parallel to the x axis).

The display 210 may include a display panel 214 (e.g., a flexible display panel), and at least one plate (or layer) 215 disposed on a rear surface of the display panel 214.

The display panel 214 may include a flexible display substrate, a plurality of display elements coupled to the display substrate to form multiple pixels, one or more conductive lines coupled to the display substrate and electrically connected to other display elements, and a thin-film pouch layer configured to prevent an inflow of oxygen and moisture from the outside. The display panel 214 may include a touch panel or may be integrally formed therewith.

The plate 215 may support the rear surface of the display panel 214, thereby improving the impact resistance of the display panel 214. The plate 215 may be disposed between the display panel 214 and the support assembly 240 to be described later, and function as a heat transfer path that transfers heat generated in an internal component (e.g., an application processor (AP)) in the electronic device 20 to the display panel 214. The plate 215 may be formed in a shape corresponding to that of the display panel 214.

The first housing 220 and the second housing 230 may form an exterior of the electronic device 20. The first housing 220 and the second housing 230 may be connected to each other with a hinge structure 343 to form the rear surface of the electronic device 20. The first housing 220 and the second housing 230 may each include a front surface, a rear surface, and a side surface that partially covers a space between the front surface and the rear surface. The front surface may be formed with most areas thereof open such that the display 210 is exposed to the outside. However, the first housing 220 and the second housing 230 may not be limited to the shape and coupling illustrated in FIG. 3, but be implemented in other shapes or by a combination and/or coupling of other components. For example, the side surface and the rear surface of each of the housings 220 and 230 are illustrated in FIG. 3 as being integrally formed. However, each of the housings 220 and 230 may be provided, as members that cover, respectively, the side surface and the rear surface of the electronic device 20 are coupled.

The first housing 220 and the second housing 230 may fix and support internal components of the electronic device 20. For example, the first housing 220 and the second housing 230 may form a space in which the display 210, the support assembly 240, the PCB 350, and the battery 300 are seated, and fix and support the seated components. The display 210 may be disposed on the first housing 220 and the second housing 230 to form a first space 221 and a second space 231, respectively. The first space 221 and the second space 231 may form one space in which the display 210 is seated through the coupling of the first housing 220 and the second housing 230.

The support assembly 240 may include a first support member 341, a second support member 342, the hinge structure 343 disposed between the first support member 341 and the second support member 342, a hinge cover configured to cover an outer surface of the hinge structure 343, and a wiring member 344 (e.g., a flexible PCB (FPCB)).

Any one of the first support member 341 and the second support member 342 may be disposed between the plate 215 and the PCB 350. For example, the first support member 341 may be disposed between the first area 211 of the display 210 and a first PCB 351, and the second support member 342 may be disposed between the second area 212 of the display 210 and a second PCB 352.

The hinge structure 343 may foldably connect the first housing 220 and the second housing 230. The first housing 220 and the second housing 230 may rotate on the folding axis A by the hinge structure 343. An angle and a distance formed between the first housing 220 and the second housing 230 may change based on a state of the electronic device 20. The display 210 may be disposed on the first housing 220 and the second housing 230, and move in response to folding and unfolding operations of the first housing 220 and the second housing 230. Accordingly, a shape of the electronic device 20 may be changed through an operation of the hinge structure 343.

For example, when the electronic device 20 is in an unfolded state, or a flat state (e.g., the state illustrated in FIG. 2A), the first housing 220 and the second housing 230 may be disposed to form an angle of 180 degrees)(° therebetween through the hinge structure 343. The first area 211 and the second area 212 of the display 210 may be disposed to face the same direction (e.g., a z-axis), thereby forming the first state in which they form substantially the same plane. The axis area 213 may form the same plane as the first area 211 and the second area 212.

For example, when the electronic device 20 is in a folded state (e.g., a state illustrated in FIG. 4B), the first housing structure 220 and the second housing structure 230 may be disposed to face each other. The first area 211 and the second area 212 of the display 210 may form a small (or narrow) angle (e.g., in a range between 0° and 10°), thereby forming the second state in which they face each other. The axis area 213 may form a curved surface having a predetermined curvature.

For example, when the electronic device 20 is in the intermediate state (e.g., the state illustrated in FIG. 2B), the first housing 220 and the second housing 230 may be disposed to form a predetermined angle through the hinge structure 343. The first area 211 and the second area 212 of the display 210 may form an angle greater than that in the folded state and smaller than that in the unfolded state. The folding area B may form a curved surface having a curvature smaller than that in the folded state.

The hinge cover 345 may cover the outer surface of the hinge structure 343 such that the hinge structure 343 is not exposed to the outside of the electronic device 20. The hinge cover 345 may be disposed between the first housing 220 and the second housing 230 and cover a space between the first housing 220 and the second housing 230. The hinge cover 345 may be covered by the first housing 220 and the second housing 230 (in the unfolded state) or be exposed to the outside of the electronic device 20 (in the folded state) based on an operating state (e.g., the unfolded state or the folded state) of the electronic device 20.

The wiring member 344 may perform a function of connecting components disposed in the first space 221 and the second space 231. The wiring member 344 may be disposed in a direction (e.g., an x-axis direction illustrated in FIG. 3) crossing the first support member 341 and the second support member 342.

The first housing 220 and the second housing 230 may be connected to both sides of the support assembly 240. For example, the support assembly 240 may be disposed on the rear surface of the display 210, and be disposed in the first housing 220 and the second housing 230.

The PCB 350 which is provided as one or more PCBs may include the first PCB 351 disposed in the first housing 220 and/or the second PCB 352 disposed in the second housing 230. The first PCB 351 may be disposed in the first space 221 formed by the first housing 220, and the second PCB 352 may be disposed in the second space 231 formed by the second housing 230. In the PCB 350, components for implementing functions of the electronic device 20 may be disposed.

Figure 4A:
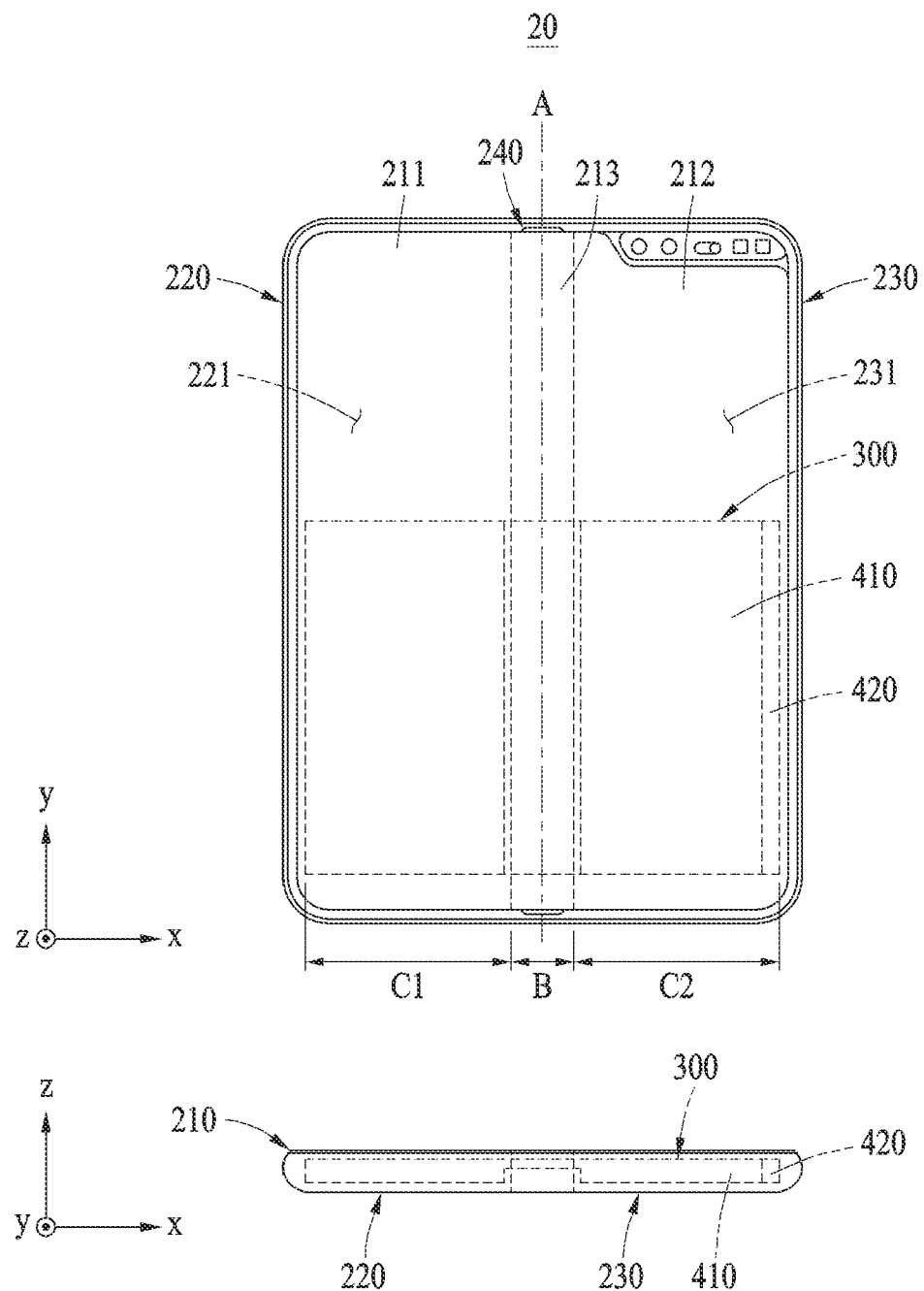
FIG. 4A is a view of an electronic device in an unfolded state according to an embodiment of the disclosure.
Figure 4B:
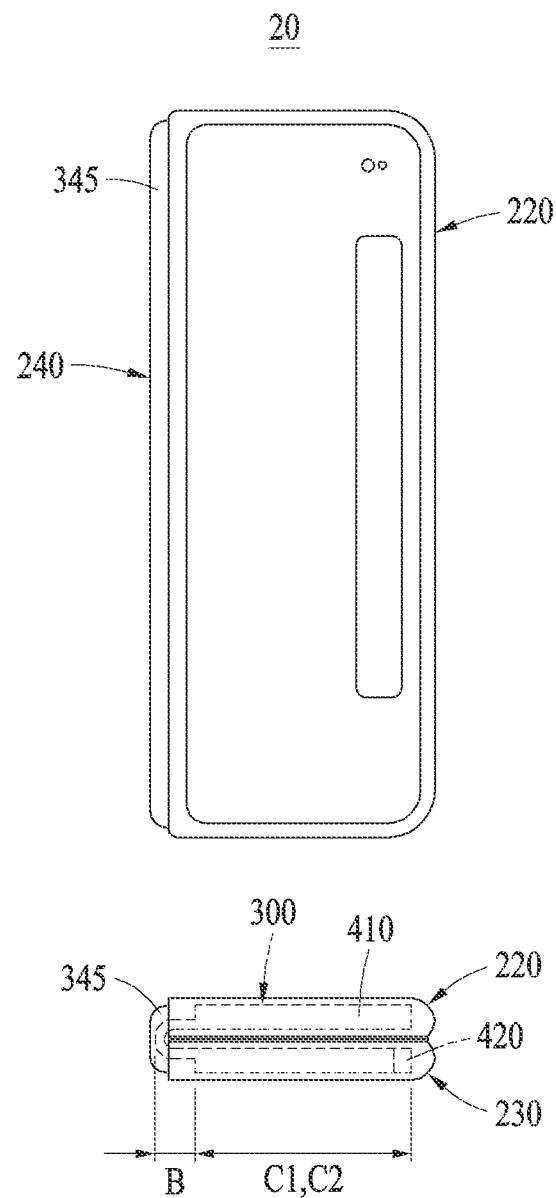
FIG. 4B is a view of an electronic device in a folded state according to an embodiment of the disclosure.

FIG. 4A is a view of an electronic device in an unfolded state according to an embodiment of the disclosure, and FIG. 4B is a view of an electronic device in a folded state according to an embodiment of the disclosure.

Referring to FIGS. 4A and 4B, the battery 300 may be disposed inside the electronic device 20 and be changed in shape in response to a folding operation of the electronic device 20. The battery 300 may include a battery pouch (e.g., a battery pouch 530 of FIG. 5), a battery cell 410 sealed in the battery pouch, and a protection circuit portion 420 extending from the battery cell 410 and electrically connected to the PCB 350.

The battery cell 410 may be disposed to extend from the first space 221 of the first housing 220 to the second space 231 of the second housing 230. The battery cell 410 may include a first cell area C1 disposed in the first space 221, a second cell area C2 disposed in the second space 231, and a folding area B that foldably connects the first cell area C1 and the second cell area C2. The folding area B may be disposed on a rear surface (or a back) of the axis area 213 of the display 210 to cross between the first area 211 and the second area 212. The folding area B may have a smaller thickness than that of the first cell area C1 and the second cell area C2, thereby reducing stress caused by being folded.

The battery cell 410 may be changed in shape by an operation of the electronic device 20. An overall shape of the battery cell 410 may be changed as the folding area B is folded or unfolded with respect to the folding axis A. For example, in an unfolded state (e.g., a state illustrated in FIG. 4A) in which the first housing 220 and the second housing 230 are unfolded, the folding area B of the battery cell 410 may be unfolded such that the first cell area C1 and the second cell area C2 are parallel to each other. In contrast, in a folded state (e.g., the state illustrated in FIG. 4B) in which the first housing 220 and the second housing 230 are folded to face each other, the folding area B of the battery cell 410 may be folded such that the first cell area C1 and the second cell area C2 face each other.

Figure 5:
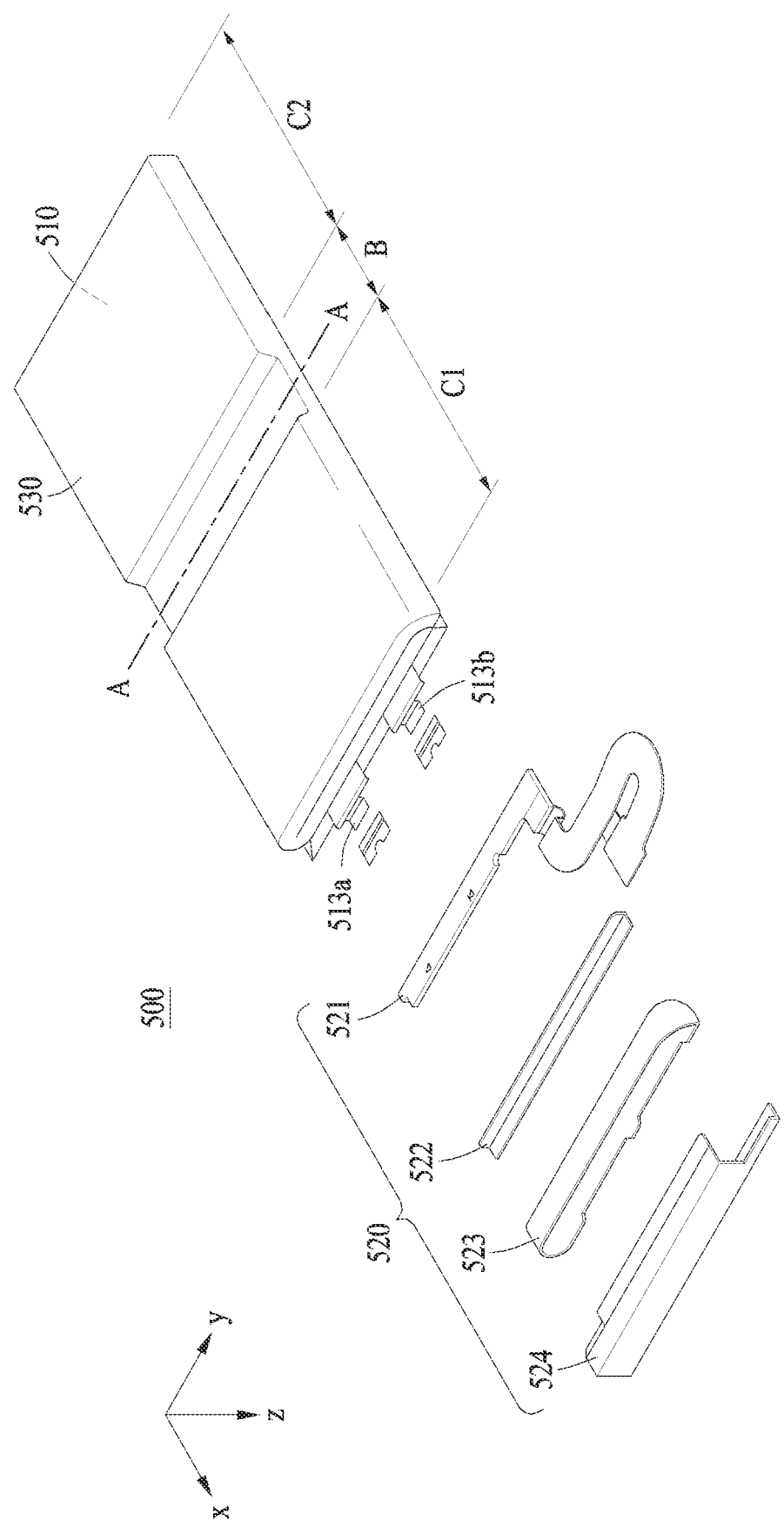
FIG. 5 is an exploded perspective view of a battery according to an embodiment of the disclosure.

FIG. 5 is an exploded perspective view of a battery according to an embodiment of the disclosure.

Referring to FIG. 5, according to an embodiment, a battery 500 (e.g., the battery 300 of FIG. 3) may include a battery cell 510 and a protection circuit portion 520.

The battery cell 510 may include a first cell area C1, a second cell area C2 spaced apart from the first cell area C1, and a folding area B connecting the first cell area C1 and the second cell area C2. The first cell area C1 and the second cell area C2 may have substantially the same size or different sizes. The sizes of the first cell area C1 and the second cell area C2 may be determined based on a position of the folding area B in the battery cell 510. The folding area B of the battery cell 510 may be folded with respect to a folding axis A.

The battery cell 510 may include a battery pouch 530 that forms an exterior. To the outside of the battery pouch 530, conductive terminals 513a and 513b may be drawn out. The conductive terminals 513a and 513b may be electrically connected to a positive electrode substrate portion (e.g., a positive electrode substrate portion 611 of FIG. 6A) and a negative electrode substrate portion (e.g., a negative electrode substrate portion 612 of FIG. 6A) inside the battery pouch 530.

The protection circuit portion 520 may be electrically connected to the battery cell 510. The protection circuit portion 520 may be electrically connected to the conductive terminals 513a and 513b drawn out to an outer surface of the battery pouch 530. The protection circuit portion 520 may include a protection circuit module (PCM) 521, a case 522 configured to accommodate the PCM 521, a coupling member 523 configured to fix the case 522 to the battery pouch 530 and reduce an impact, and a closing member 524 connected to simultaneously cover both the case 522 and the outer surface of the battery pouch 530.

The PCM 521 may include one or more circuit elements capable of electrically protecting the battery cell 510 and a circuit board (e.g., a rigid PCB) on which the circuit elements may be mounted. The PCM 521 may be used to maintain a voltage or current within a predetermined range during charging and discharging of the battery cell 510. For example, the PCM 521 may prevent the battery cell 510 from being damaged by controlling the battery cell 510 to operate in a stable voltage range or to be charged or discharged with a stable current range.

Figure 6A:
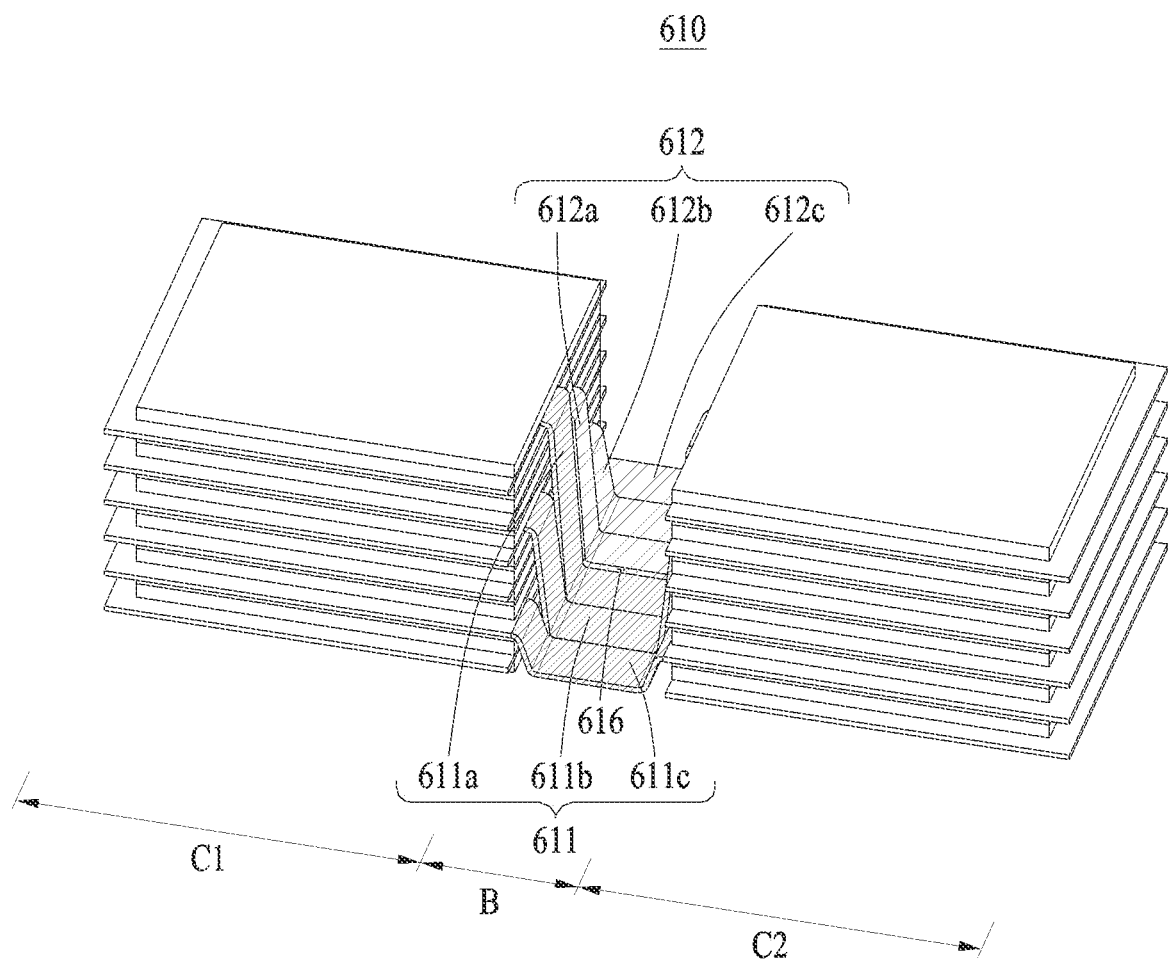
FIGS. 6A, 6B, and 6C are views of a battery cell viewed from various directions according to various embodiments of the disclosure.
Figure 6B:
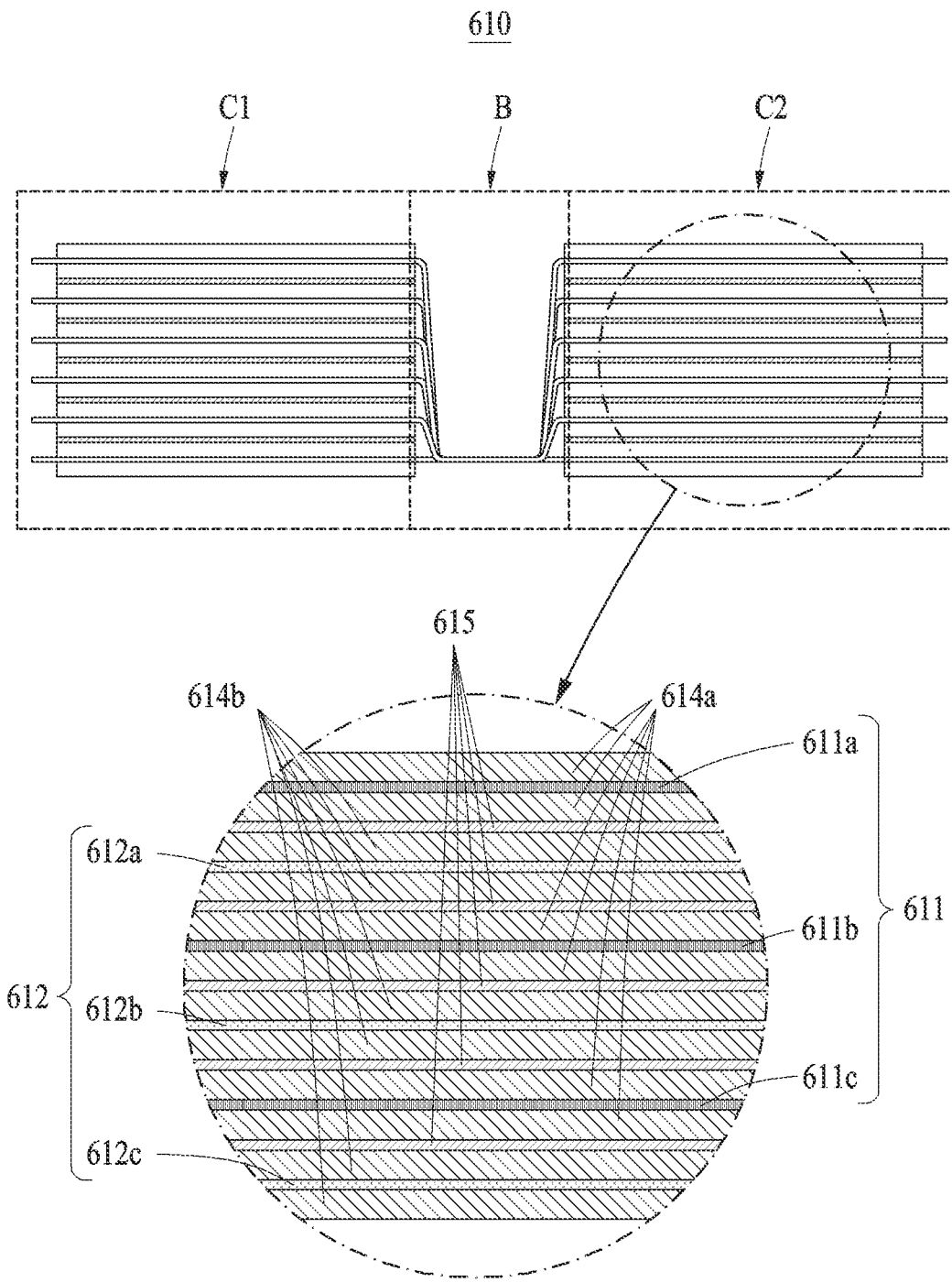
Figure 6C:
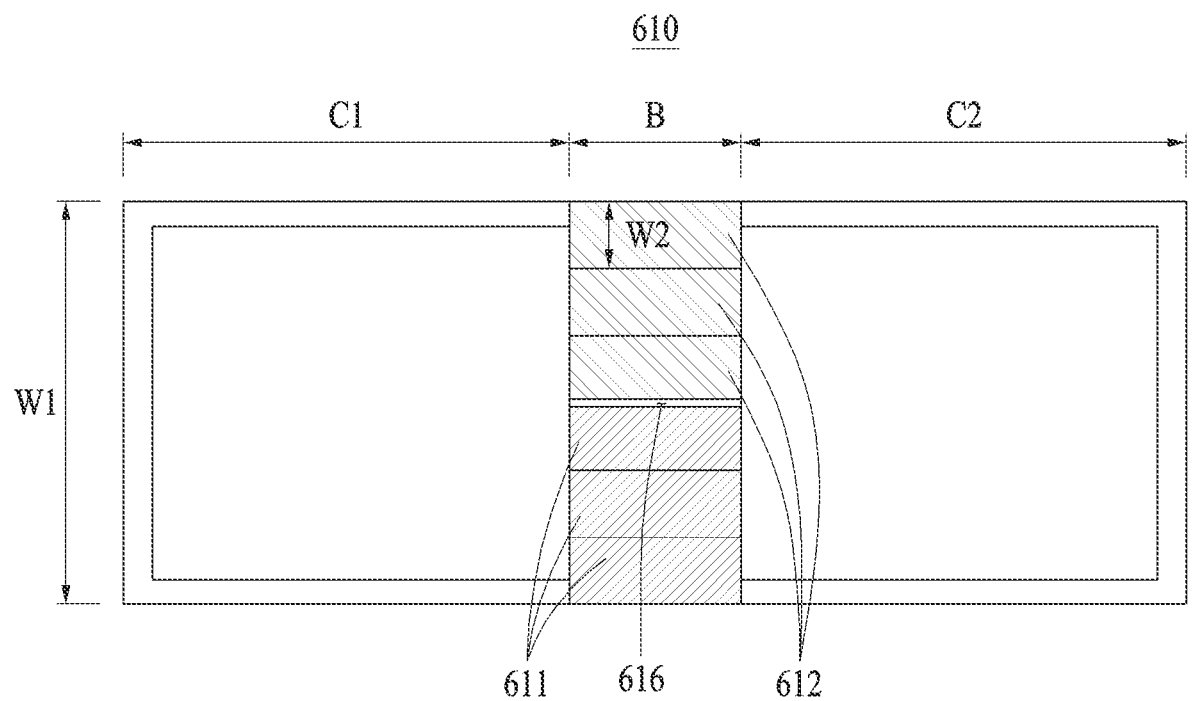

FIGS. 6A, 6B, and 6C are views of a battery cell viewed from various directions according to various embodiments of the disclosure.

Referring to FIGS. 6A, 6B, and 6C, a battery cell 610 may include a plurality of substrate members 611 and 612 stacked while being electrically insulated through a separation membrane 615, and a plurality of mixture layers 614a and 614b. The battery cell 610 may include a first cell area C1 and a second cell area C2 that are spaced apart from each other, and a folding area B that connects the first cell area C1 and the second cell area C2.

The substrate member 611 and 612, for example, a plurality of current collectors, may be stacked in a longitudinal direction. For example, the substrate member 611 and 612 may have the longitudinal direction extending from the first cell area C1 to the second cell area C2 through the folding area B. The substrate member 611 and 612 may include one or more positive electrode substrate member 611a, 611b, and 611c and one or more negative electrode substrate member 612a, 612b, and 612c that form opposite electrodes. The number of the positive electrode substrate member 611a, 611b, and 611c and the number of the negative electrode substrate member 612a, 612b, and 612c may be the same.

The battery cell 610 is illustrated as including the three positive electrode substrate member 611a, 611b, and 611c and the three negative electrode substrate member 612a, 612b, and 612c, respectively, but is provided merely as an example. For example, the battery cell 610 may include the substrate member 611 and 612 including four or more positive and negative substrate member to be stacked. Also, the battery cell 610 may include two positive electrode substrate members and two negative substrate members, as illustrated as a battery cell 910 of FIG. 9A, or include one positive electrode substrate portion and one negative electrode substrate portion as illustrated as a battery cell 1010 in FIG. 10A.

The positive electrode substrate member 611a, 611b, and 611c and the negative electrode substrate member 612a, 612b, and 612c may be formed of different materials to have a difference in standard redox potential. The positive electrode substrate member 611a, 611b, and 611c may be formed of a highly conductive plate-shaped metal material, such as, for example, aluminum, stainless steel, nickel, titanium, or sintered carbon. The negative electrode substrate member 612a, 612b, and 612c may be formed of a highly conductive plate-shaped metal material, such as, for example, copper, stainless steel, aluminum, nickel, titanium, or sintered carbon.

In the first cell area C1 and the second cell area C2, the substrate member 611 and 612 may be stacked such that the positive electrode substrate member 611a, 611b, and 611c and negative electrode substrate member 612a, 612b, and 612c are stacked alternately with each other. The substrate member 611 and 612 may be stacked while being electrically insulated through the separation membrane 615. The separation membrane 615 may be disposed between the positive electrode substrate member 611a, 611b, and 611c and the negative electrode substrate member 612a, 612b, and 612c to prevent direct contact between the positive electrode substrate member 611a, 611b, and 611c and the negative electrode substrate member 612a, 612b, and 612c and allow electrons to move between neighboring substrate member (e.g., 611 and 612). The separation membrane 615 may be provided using a thin film of an insulating material having high ionic permeability and mechanical strength. For example, the separation membrane 615 may include a sheet or nonwoven fabric formed of an olefin-based polymer such as chemical-resistant and hydrophobic polypropylene, glass fiber, or polyethylene. The separation membrane 615 may be disposed only in the first cell area C1 and the second cell area C2. That is, the separation membrane 615 may be omitted in the folding area B.

The mixture layers 614a and 614b may be applied respectively to the surfaces of the substrate member 611 and 612.

The mixture layers 614a and 614b may be formed of a mixture of an active material, a conductive material, and a binder, or be formed by further adding a filler to the mixture. The mixture layers 614a and 614b may include a positive electrode mixture layer 614a (e.g., a positive electrode active material) applied to the surface of the positive electrode substrate member 611a, 611b, and 611c, and a negative electrode mixture layer 614b (e.g., a negative electrode active material) applied to the surface of the negative electrode substrate member 612a, 612b, and 612c. The positive electrode active material included in the positive electrode mixture layer 614a may include, for example, lithium cobalt oxide, lithium nickel oxide, lithium manganese oxide, or lithium copper oxide. The negative electrode active material included in the negative electrode mixture layer 614b may include, for example, non-graphitizing carbon, graphite-based carbon, lithium metal, lithium alloy, silicon-based alloy, or tin-based alloy. The mixture layers 614a and 614b may be applied to the surfaces of the substrate member 611 and 612 disposed in the first cell area C1 and the second cell area C2. That is, the mixture layers 614a and 614b may be omitted from the surfaces of the substrate member 611 and 612 disposed in the folding area B.

The battery cell 610 may have a stacked structure in which the substrate member 611 and 612 are disposed with the mixture layers 614a and 614b and the separation membrane 615 being omitted in the folding area B. For example, the surfaces of the substrate member 611 and 612 may be exposed in the folding area B. In the folding area B, the substrate member 611 and 612 may be disposed such that there is no substantial overlap between the substrate member 611 and 612 forming opposite electrodes. For example, in the folding area B, the substrate member 611 and 612 may be disposed such that electrodes formed by the substrate member 611 and 612 are divided into both sides of an imaginary boundary line parallel to the longitudinal direction. That is, in the folding area B, the positive electrode substrate member 611a, 611b, and 611c and the negative electrode substrate member 612a, 612b, and 612c may be disposed not to overlap each other. The positive electrode substrate member 611a, 611b, and 611c and the negative electrode substrate member 611a, 612b, and 612c may be disposed in a non-contact state to prevent a short circuit from occurring. A gap 616 may be formed to prevent contact between neighboring electrodes among opposite electrodes in the folding area B, for example, between the positive electrode substrate portion 611a and the negative electrode substrate portion 612a of FIG. 6A. For example, a notch may be formed on at least one side of a pair of substrate member (e.g., 612a and 612b) that are disposed adjacent to each other and form opposite electrodes. The gap 616 for preventing the contact between the substrate member 611 and 612 forming the opposite electrodes may be small enough not to substantially affect the width of the substrate member 611 and 612.

Such a structure may reduce a thickness of the battery cell 610 in the folding area B compared to a thickness thereof in the first cell area C1 or the second cell area C2, and thus increase flexibility in the folding area B and secure electrical insulation between the substrate member 611 and 612 even without the separation membrane 615.

The substrate member 611 and 612 may be disposed such that the substrate member 611 and 612 do not overlap each other in the folding area B. For example, based on a state (e.g., a state illustrated in FIG. 6C) viewed from a direction in which the substrate member 611 and 612 are stacked, the folding area B may be divided into a plurality of areas parallel to each other, and the substrate member 611 and 612 may be disposed so as not to overlap each other in each divided area. The substrate member 611 and 612 may be formed such that a width W2 in the folding area B is smaller (or narrower) than a width W1 in the first cell area C1 and the second cell area C2, thereby being disposed only in each divided area of the folding area B. In the folding area B, the substrate member 611 and 612 may have the same width W2 and may be arranged side by side. A total sum of respective widths W1 of the substrate member 611 and 612 arranged side by side in the folding area B may be substantially the same as the width W1 of one of the substrate members 611 and 612 in the first cell area C1 or the second cell area C2.

The substrate member 611 and 612 may form a stacked structure substantially the same as that of one of the substrate members 611 and 612 in the folding area B. For example, based on a direction of a thickness of the battery cell 610 (e.g., a state illustrated in FIG. 6B), the folding area B may have a stacked structure disposed at the same height such that the substrate member 611 and 612 have the same thickness as the thickness formed by one of the substrate member 611 and 612. Such a structure may reduce the thickness of the battery cell 610 in the folding area B, thereby improving flexibility of the battery cell 610 in the folding area B.

The substrate member 611 and 612 in the folding area B may have different lengths. In a cell area, the substrate member 611 and 612 may be stacked such that the positive electrode substrate member 611a, 611b, and 611c and the negative electrode substrate member 612a, 612b, and 612c are alternately stacked with the separation membrane 615 or the mixture layers 614a and 614b disposed therebetween. That is, a positive electrode substrate portion and a negative electrode substrate portion may be sequentially and repeatedly stacked. Based on a state viewed from a folding direction (e.g., the state illustrated in FIG. 6B), the substrate member 611 and 612 may be disposed at different heights according to a stacking order. In contrast, in the folding area B, the substrate member 611 and 612 may be arranged side by side while areas are separated so as not to overlap, and may be disposed at substantially the same height to form a stacked structure of a single substrate layer. Accordingly, the substrate member 611 and 612 may have different heights in the cell area and the folding area B. The substrate member 611 and 612 may have different lengths in the folding area B, thereby securing an extra length to compensate for the height difference occurring in the cell area and the folding area B. Such a structure may reduce a stress concentration phenomenon applied to the substrate member 611 and 612 when the folding area B is folded, and ensure the degree of freedom of folding of the folding area B.

In a state viewed from a folding axis direction (e.g., a state illustrated in FIG. 6C), a stacked structure formed by the substrate member 611 and 612 in the folding area B may be disposed to be inclined in a direction in which the first cell area C1 and the second cell area C2 of the battery cell 610 are folded to face each other. Such a structure may secure a sufficient degree of freedom of folding such that the first cell area C1 and the second cell area C2 are unfolded (for example, an unfolded state illustrated in FIG. 4A) or the first cell area C1 and the second cell area C2 face each other (for example, a folded state illustrated in FIG. 4B), while minimizing the length of the folding area B, that is, a gap between the first cell area C1 and the second cell area C2.

The substrate member 611 and 612 may be arranged such that substrate member forming the same electrode in the folding area B are gathered. For example, in a state viewed from a stacked direction (e.g., the state illustrated in FIG. 6C), the positive electrode substrate member 611a, 611b, and 611c and the negative electrode substrate member 612a, 612b, and 612c may be arranged by being divided into both sides of an imaginary boundary line. For example, the gap 616 for preventing a short circuit may be formed between the positive electrode substrate portion 611a and the negative electrode substrate portion 612b disposed on both sides of the boundary line. Such a structure may minimize an adjoining portion between the substrate member 611 and 612 forming opposite electrodes, thereby safely securing an electrically insulated state between the positive electrode substrate member 611a, 611b, and 611c and the negative electrode substrate member 612a, 612b, and 612c.

Figure 7:
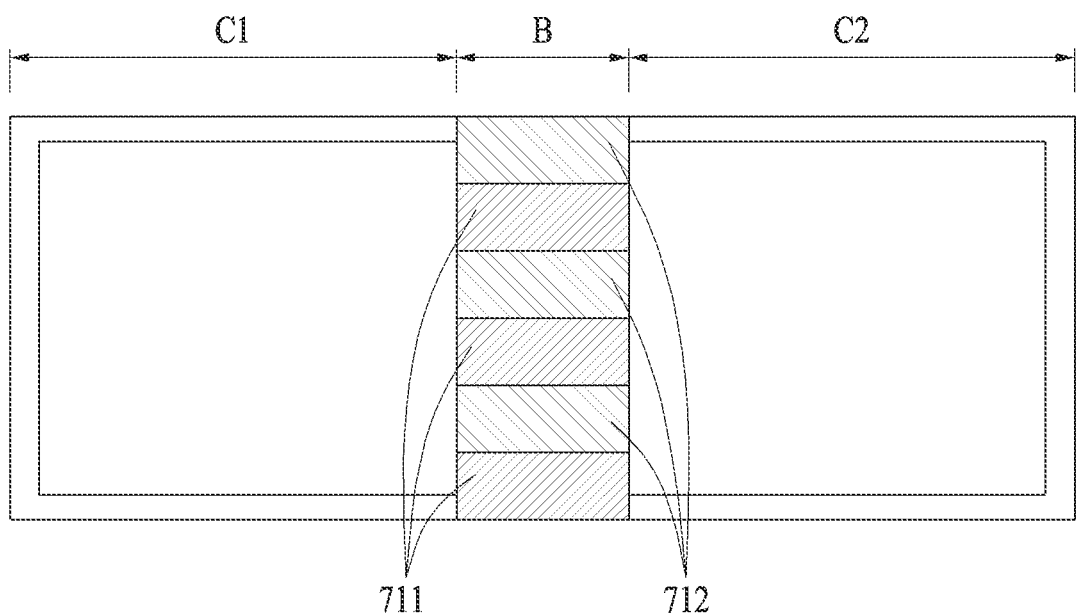
FIG. 7 is a view of a battery cell viewed from a stacked direction according to an embodiment of the disclosure.

FIG. 7 is a view of a battery cell viewed from a stacked direction according to an embodiment of the disclosure.

Referring to FIG. 7, according to an embodiment, a battery cell 610' may include a plurality of substrate members 711 and 712 (e.g., the substrate member 611 and 612 of FIG. 6A) having a longitudinal direction extending from a first cell area C1 to a second cell area C2 through a folding area B. The substrate member 711 and 712 may include one or more positive electrode substrate member 711 and one or more negative electrode substrate member 712 that form different electrodes.

In the folding area B, the substrate member 711 and 712 may be stacked by separating arrangement areas such that a substantial overlap between them does not occur. The substrate member 711 and 712 may be arranged such that substrate member 711 and 712 forming opposite electrodes are alternately arranged along a width direction of the folding area B (e.g., a direction perpendicular to the longitudinal direction of the substrate member 711 and 712). That is, the positive electrode substrate member 711 and the negative electrode substrate member 712 may be alternately disposed along the width direction of the folding area B. The positive electrode substrate member 711 and the negative electrode substrate member 712 disposed in the folding area B may be disposed with a small gap therebetween so as not to contact each other. The substrate member 711 and 712 may be disposed not to overlap each other, and thus an electrically insulated state between the positive electrode substrate member 711 and the negative electrode substrate member 712 may be secured.

Figure 8A:
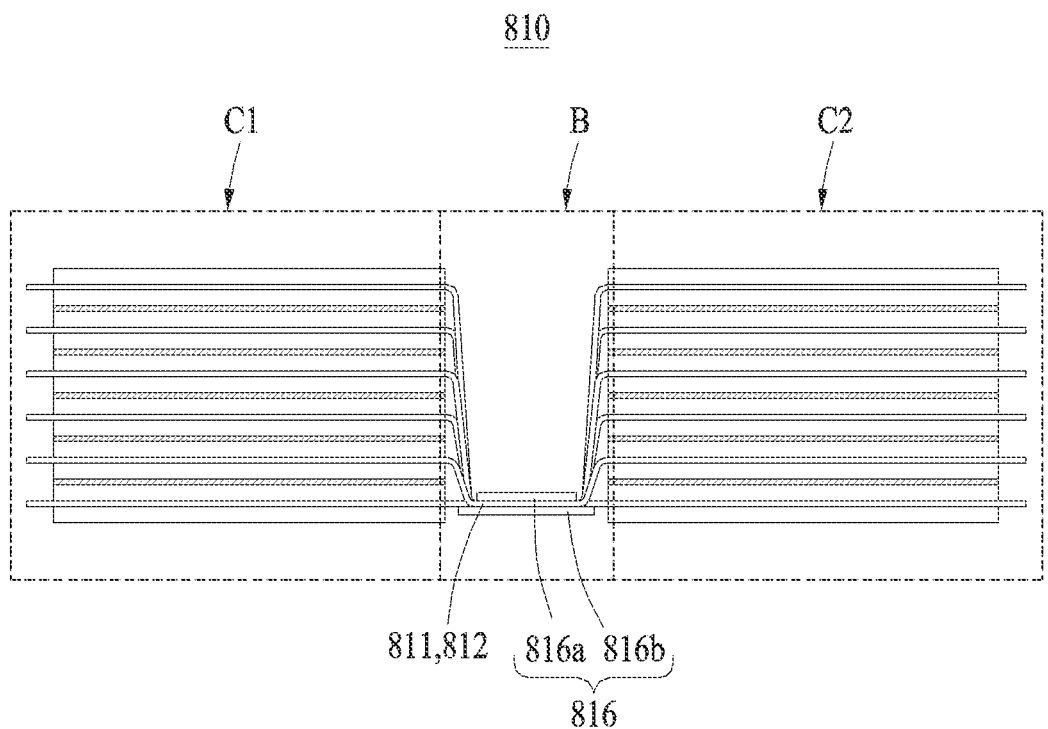
FIGS. 8A, 8B, and 8C are views of a battery cell viewed from various directions according to various embodiments of the disclosure.
Figure 8B:
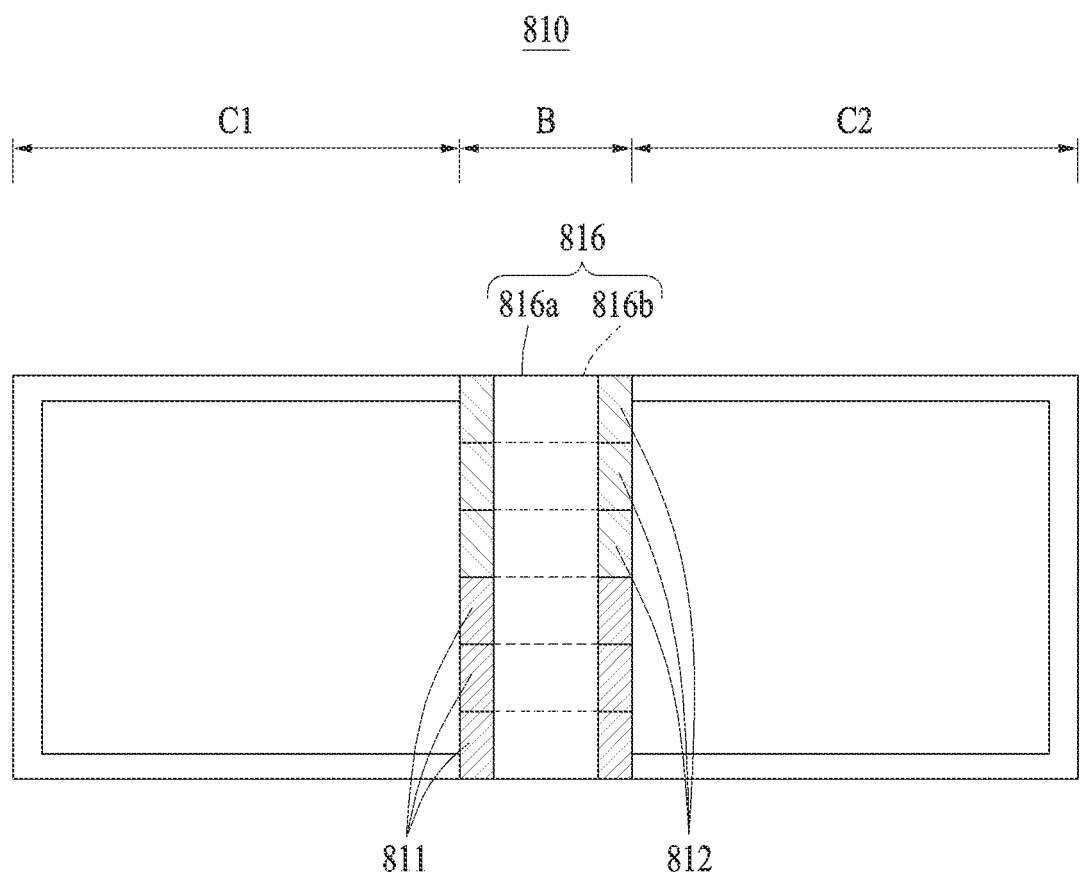
Figure 8C:
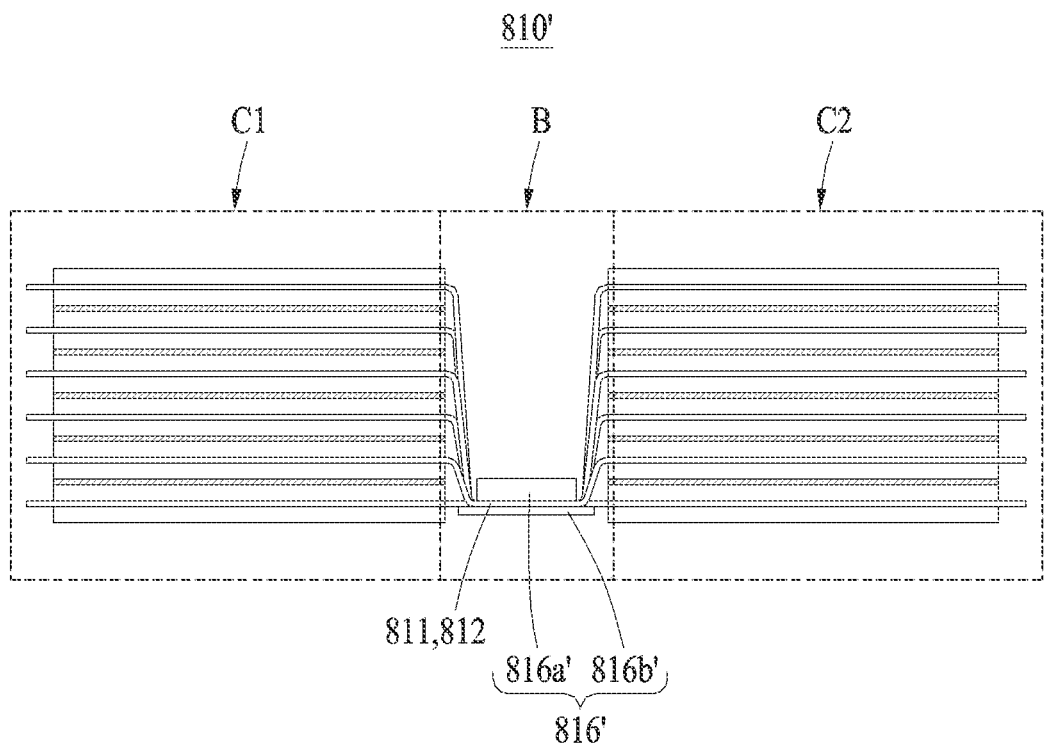

FIGS. 8A, 8B, and 8C are views of a battery cell viewed from various directions according to various embodiments of the disclosure.

Referring to FIGS. 8A and 8B, according to various embodiments, a battery cell 810 may include a plurality of substrate members 811 and 812 extending from a first cell area C1 to a second cell area C2 through a folding area B, and a reinforcing member 816 stacked on an exposed surface of the substrate member 811 and 812.

The substrate member 811 and 812 may include a positive electrode substrate portion 811 and a negative electrode substrate portion 812 that form opposite electrodes. The substrate member 811 and 812 may secure an electrically insulated state as the positive electrode substrate portion 811 and the negative electrode substrate portion 812 are alternately stacked in the first cell area C1 and the second cell area C2 with a separation membrane (e.g., the separation membrane 615 of FIG. 6B) therebetween, and secure an electrically insulated state as arrangement areas are separated such that they do not overlap each other in the folding area B. The substrate member 811 and 812 may be disposed while a surface thereof is exposed in the folding area B. For example, a mixture layer (e.g., the mixture layers 614a and 614b of FIG. 6B) may be omitted from the surface of the substrate member 811 and 812 disposed in the folding area B.

The reinforcing member 816 may improve durability of the substrate member 811 and 812. The reinforcing member 816 may be stacked on the exposed surface of the substrate member 811 and 812 in the folding area B, and improve bending strength of the substrate member 811 and 812 such that the substrate member 811 and 812 may become tolerant to a repeated folding operation. The reinforcing member 816 may be formed of a material capable of securing sufficient bending rigidity while having a thin thickness, for example, polyimide (PI) or glass. The glass may be, for example, an ultra-thin glass (UTG) having a thickness of 100 μm or less.

Based on a state (e.g., a state illustrated in FIG. 8A) viewed from a folding axis direction, the reinforcing member 816 may be stacked on one surface or both surfaces of the substrate member 811 and 812. For example, based on a folded state of the folding area B, the reinforcing member 816 may include a first reinforcing member 816a disposed on a first surface of the substrate member 811 and 812 that are folded to face each other, and a second reinforcing member 816b disposed on a second surface opposite to the first surface. The first reinforcing member 816a and the second reinforcing member 816b may be formed to have the same size, and may also be formed to have different sizes. For example, based on the state (e.g., the state illustrated in FIG. 8A) viewed from the folding axis direction, the first reinforcing member 816a may be formed to be longer in length than the second reinforcing member 816b, thereby covering a larger area of the substrate member 811 and 812 compared to the second reinforcing member 816b.

For example, when the substrate member 811 and 812 are disposed in the folding area B so as not to overlap each other, the reinforcing member 816 may be disposed on surfaces of all the substrate member 811 and 812 disposed in the folding area B. The reinforcing member 816 may be integrally formed as illustrated in FIG. 8B to simultaneously cover the surfaces of the substrate member 811 and 812. However, the reinforcing member 816 may be individually stacked on a surface of each of the substrate member 811 and 812.

Referring to FIG. 8C, according to an embodiment, a battery cell 810' may include a reinforcing member 816' with a first reinforcing member 816a' and a second reinforcing member 816b' that are respectively stacked on both surfaces of substrate member 811 and 812 disposed in a folding area B and have different thicknesses. The first reinforcing member 816a' may be disposed on a first surface of the substrate member 811 and 812 that are folded to face each other in a folded state in which the folding area B is folded, and the second reinforcing member 816b' may be disposed on a second surface opposite to the first surface. The second reinforcing member 816b' may have a greater thickness than that of the first reinforcing member 816a'.

Figure 9A:
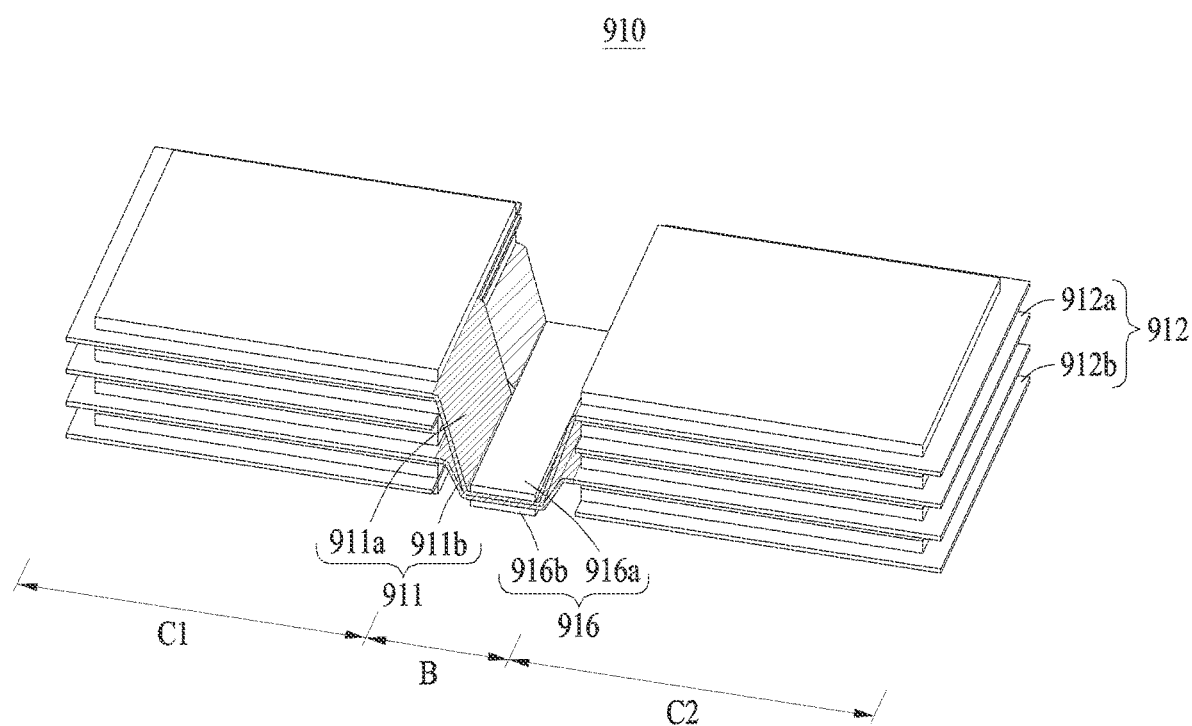
FIGS. 9A, 9B, and 9C are views of a battery cell viewed from various directions according to various embodiments of the disclosure.
Figure 9B:
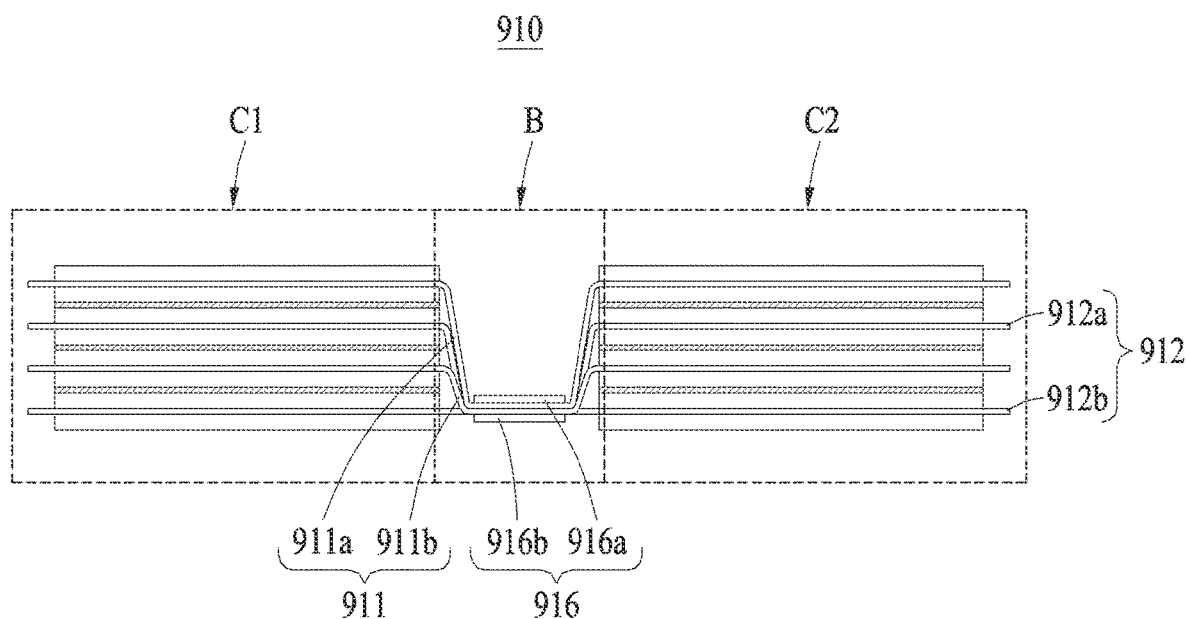
Figure 9C:
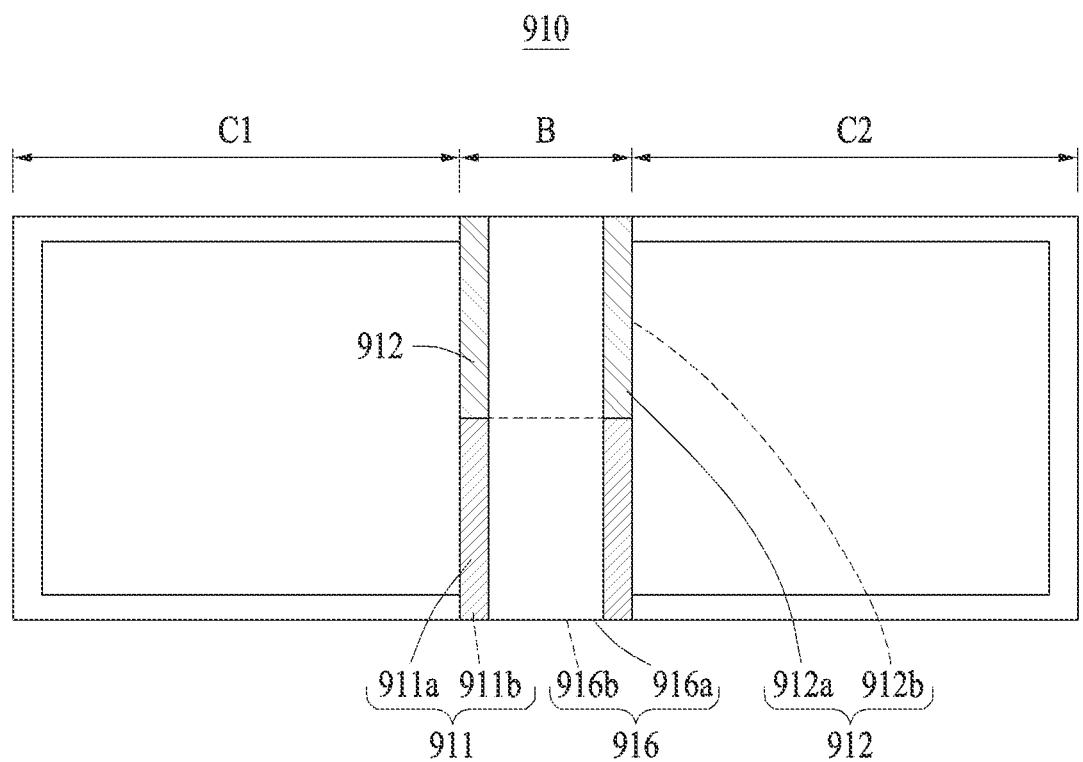

FIGS. 9A, 9B, and 9C are views of a battery cell viewed from various directions according to various embodiments of the disclosure.

Referring to FIGS. 9A, 9B, and 9C, a battery cell 910 may include a plurality of substrate members 911 and 912 extending from a first cell area C1 to a second cell area C2 through a folding area B, and a reinforcing member 916 for securing durability of the substrate member 911 and 912.

The substrate member 911 and 912 may include one or more positive electrode substrate member 911a and 911b and one or more negative electrode substrate member 912a and 912b that form opposite electrodes. The substrate member 911 and 912 may be arranged by being separated therefrom such that the positive electrode substrate member 911a and 911b and the negative electrode substrate member 912a and 912b do not overlap each other in the folding area B. For example, the folding area B may include two areas separated side by side, and the substrate member 911 and 912 may be disposed in any one of the two areas according to the electrodes formed thereby. That is, the positive electrode substrate member 911a and 911b and the negative electrode substrate member 912a and 912b may be disposed by dividing the folding area B. The substrate member 911 and 912 may be stacked such that substrate member (e.g., any one of the positive electrode substrate member 911 and any one of the negative electrode substrate member 912) forming the same electrode overlap each other in the folding area B. A mixture layer may be omitted from a surface of the substrate member 911 and 912 disposed in the folding area B. Accordingly, the substrate member 911 and 912 forming the same electrode may be sequentially stacked in the folding area B according to a stacking order in the cell areas C1 and C2. Using this structure, only contact between the substrate member (e.g., any one of the positive electrode substrate member 911 and any one of the negative electrode substrate member 912) forming the same electrode may occur in the folding area B, and an arrangement area may be divided for the positive electrode substrate member 911 and the negative electrode substrate member 912. Thus, an electrically insulated state may be secured without a mixture layer (e.g., the mixture layers 614a and 614b of FIG. 6B) and a separation membrane (e.g., the separation membrane 615 of FIG. 6B) in the folding area B, and the folding area B may be formed with a small (or thin) thickness.

A width of the substrate member 911 and 912 in the folding area B may be smaller (or narrower) than a width thereof in the cell areas C1 and C2. For example, the width of the substrate member 911 and 912 in the cell areas C1 and C2 may be substantially twice, compared to the width of the substrate member 911 and 912 in the folding area B. A width of the positive electrode substrate member 911a and 911b and a width of the negative electrode substrate member 912a and 912b may be the same in the folding area B. In a state in which the positive electrode substrate member 911a and 911b and the negative electrode substrate member 912a and 912b are arranged side by side in the folding area B, the entire width of the folding area B formed by the substrate member 911 and 912 and the entire width of the cell areas C1 and C2 may be substantially the same.

The reinforcing member 916 may be disposed on an outer surface of the substrate member 911 and 912 exposed in the folding area B. For example, in a state viewed from an axial direction (e.g., a state illustrated in FIG. 9B), the reinforcing member 916 may be disposed on the outer surface of the substrate member 911 and 912 exposed at a lowermost or uppermost end in the folding area B. The reinforcing member 916 may include a first reinforcing member 916a disposed on the exposed outer surface of the substrate member 911 and 912 disposed at the lowermost end, and a second reinforcing member 916b disposed on the exposed outer surface of the substrate member 911 and 912 disposed at the uppermost end, based on a height direction of FIG. 9B.

Figure 10A:
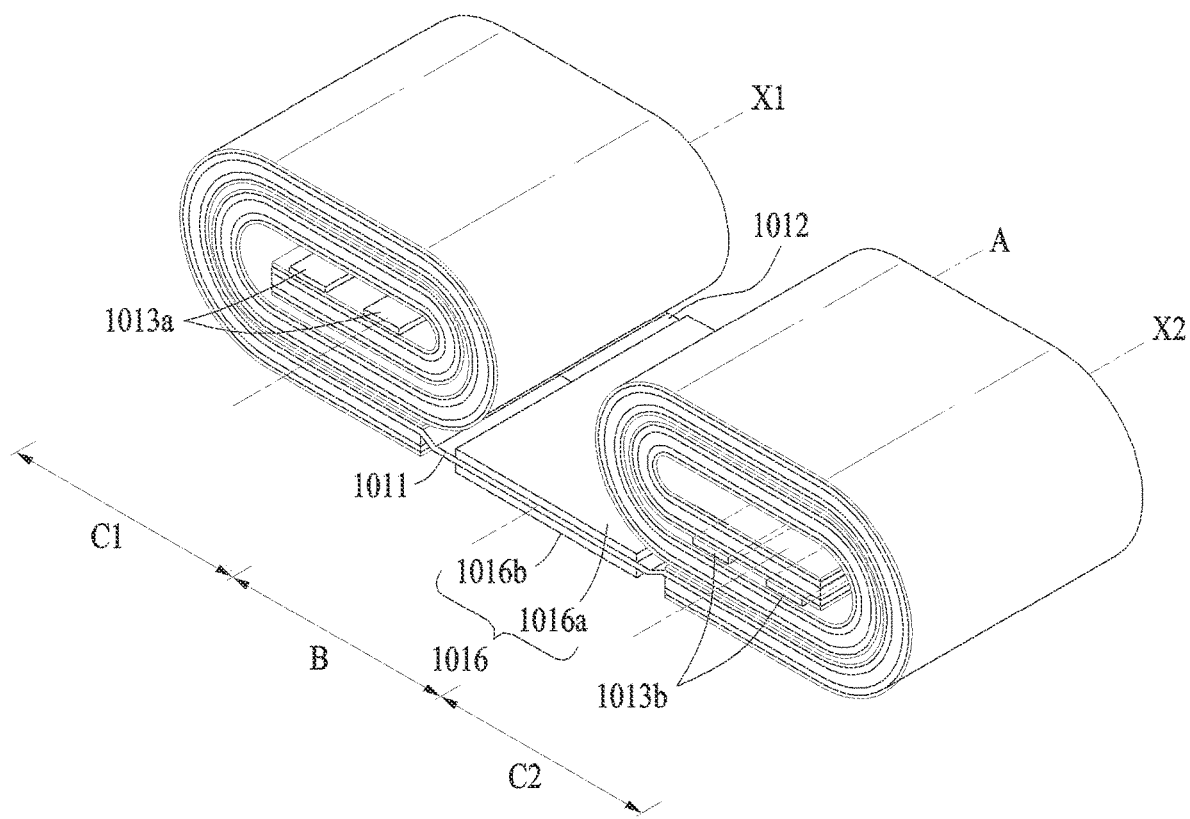
FIGS. 10A, 10B, and 10C are views of a battery cell viewed from various directions according to various embodiments.
Figure 10B:
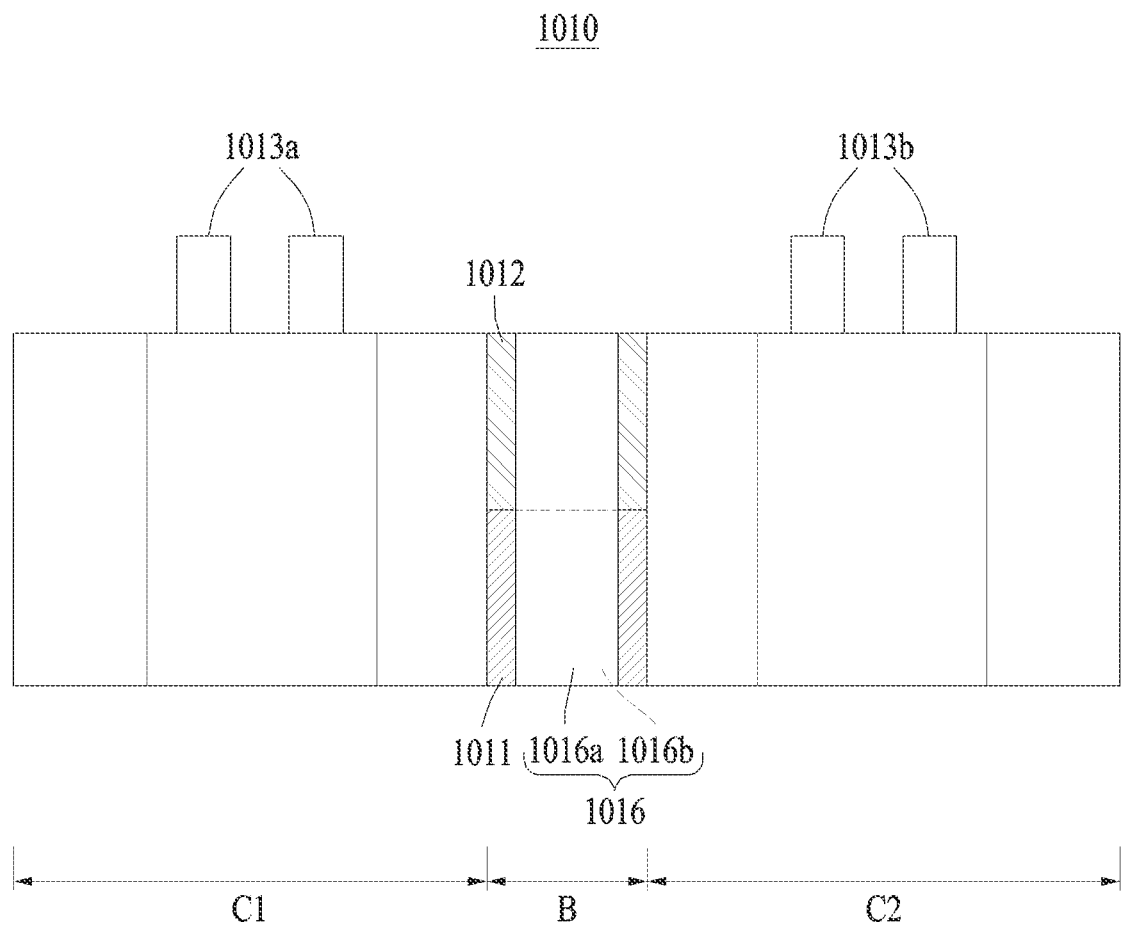
Figure 10C:
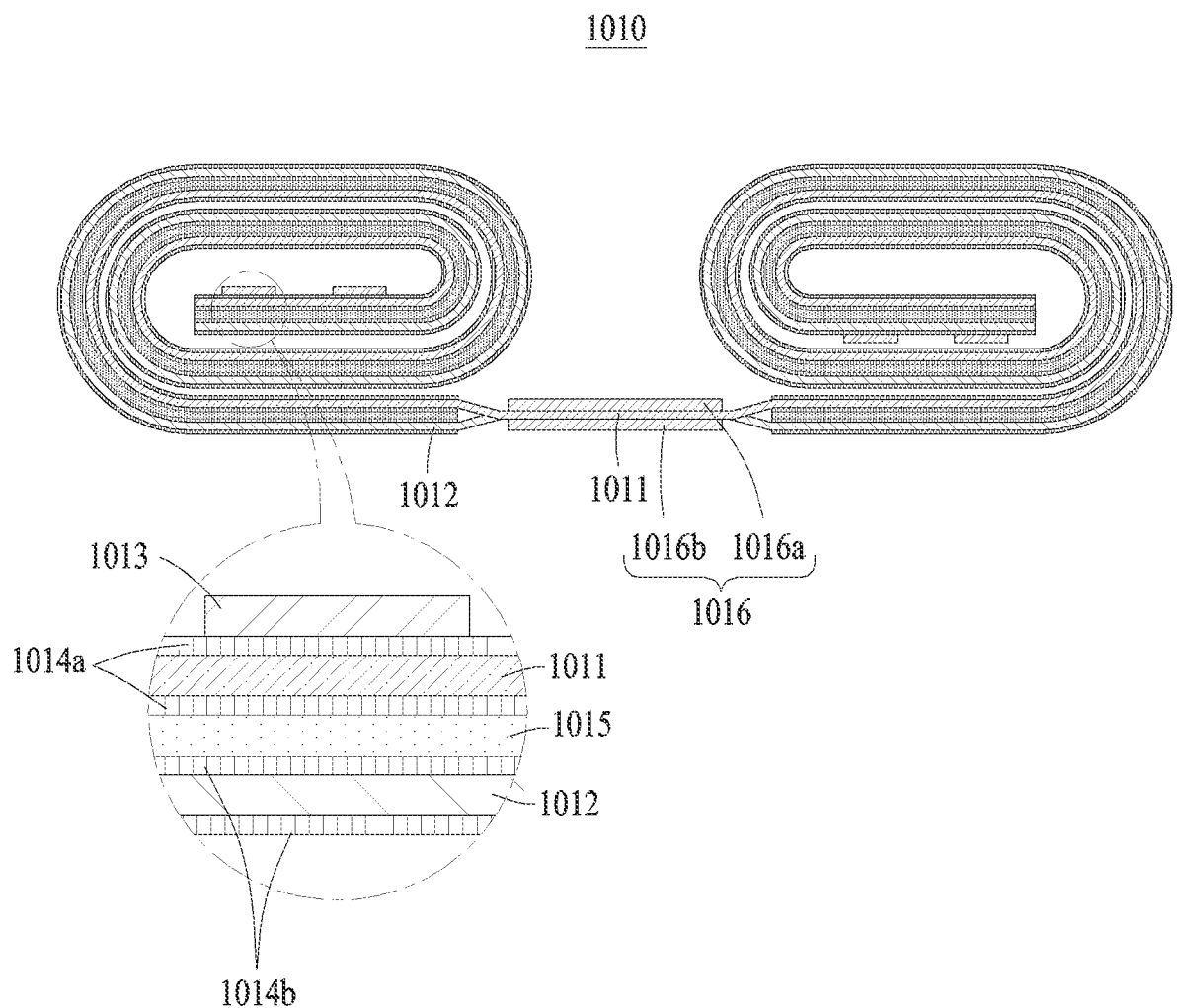

FIGS. 10A, 10B, and 10C are views of a battery cell viewed from various directions according to various embodiments of the disclosure.

Referring to FIGS. 10A, 10B, and 10C, according to various embodiments, a battery cell 1010 may include a first cell area C1 and a second cell area C2, and a folding area B connecting the first cell area C1 and the second cell area C2.

The battery cell 1010 may include a plurality of substrate members 1011 and 1012 extending from the first cell area C1 to the second cell area C2 along the folding area B. The substrate member 1011 and 1012 may form opposite electrodes, and include a positive electrode substrate portion 1011 and a negative electrode substrate portion 1012 that are stacked in the first cell area C1 and the second cell area C2 with a separation membrane 1015 disposed therebetween.

The substrate member 1011 and 1012 stacked in the cell areas C1 and C2 may be wound around winding axes X1 and X2 parallel to a folding axis A. For example, the substrate member 1011 and 1012 disposed in the first cell area C1 may be wound around the first winding axis X1, and the substrate member 1011 and 1012 disposed in the second cell area C2 may be wound around the second winding axis X2. A positive electrode terminal 1013a may be connected to the positive electrode substrate portion 1011, and a negative conductive terminal 1013b may be connected to the negative electrode substrate portion 1012.

Mixture layers 1014a and 1014b may be applied to a surface of the substrate member 1011 and 1012 in the first cell area C1 and the second cell area C2. The mixture layers 1014a and 1014b may include a positive electrode mixture layer 1014a (e.g., a positive electrode active material) coated on the surface of the positive electrode substrate portion 1011, and a negative electrode mixture layer 1014b (e.g., a negative electrode active material) coated on the surface of the negative electrode substrate portion 1012. Although not illustrated in the drawings, a separation membrane (e.g., the separation membrane 1015 of FIG. 10C) may be disposed on an outer surface of the substrate member 1011 and 1012 disposed at an uppermost or lowermost end of the stacked substrate member 1011 and 1012 in the first cell area C1 and the second cell area C2 to maintain electrical insulation with a substrate portion forming another electrode in a state of being wound.

The substrate member 1011 and 1012 may be stacked in a state in which arrangement areas are separated such that that the positive electrode substrate portion 1011 and the negative electrode substrate portion 1012 do not overlap each other in the folding area B. When the substrate member 1011 and 1012 includes one positive electrode substrate portion 1011 and one negative electrode substrate portion 1012, the positive electrode substrate portion 1011 and the negative electrode substrate portion 1012 may be arranged side by side at the same height in the folding area B. The mixture layers 1014a and 1014b may be omitted from the surface of the substrate member 1011 and 1012 disposed in the folding area B. The arrangement areas of the positive electrode substrate portion 1011 and the negative electrode substrate portion 1012 may be separated in the folding area B, and thus the folding area B may maintain an electrically insulated state between substrate member having a thickness of a single substrate layer and forming opposite electrodes.

A reinforcing member 1016 may be disposed on an exposed surface of the substrate member 1011 and 1012 disposed in the folding area B. The reinforcing member 1016 may include a first reinforcing member 1016a disposed on a first surface of the substrate member 1011 and 1012 facing each other during a folding process, and a second reinforcing member 1016b disposed on a second surface opposite to the first surface.

Figure 11A:
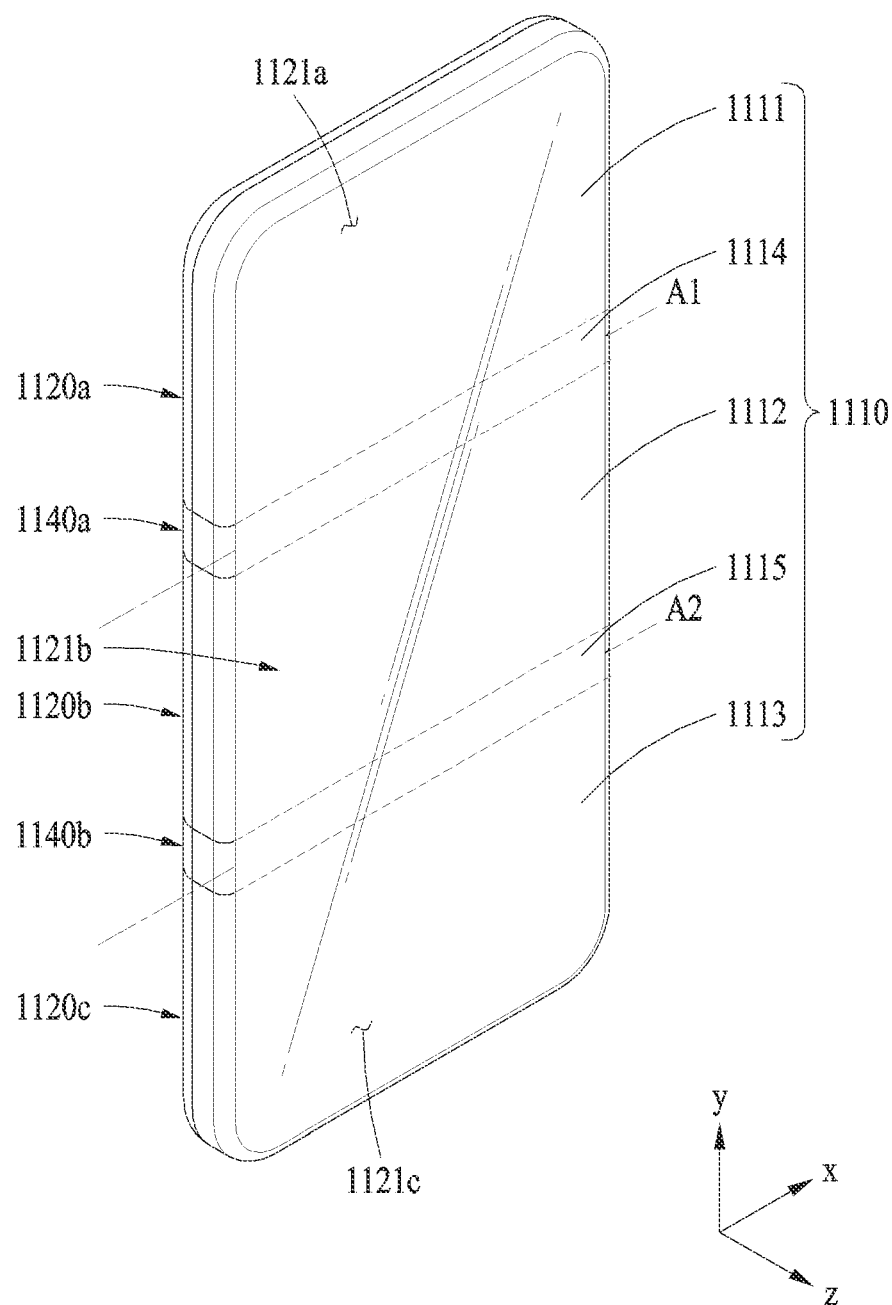
FIG. 11A is a perspective view of an electronic device in an operating state according to an embodiment of the disclosure.
Figure 11B:
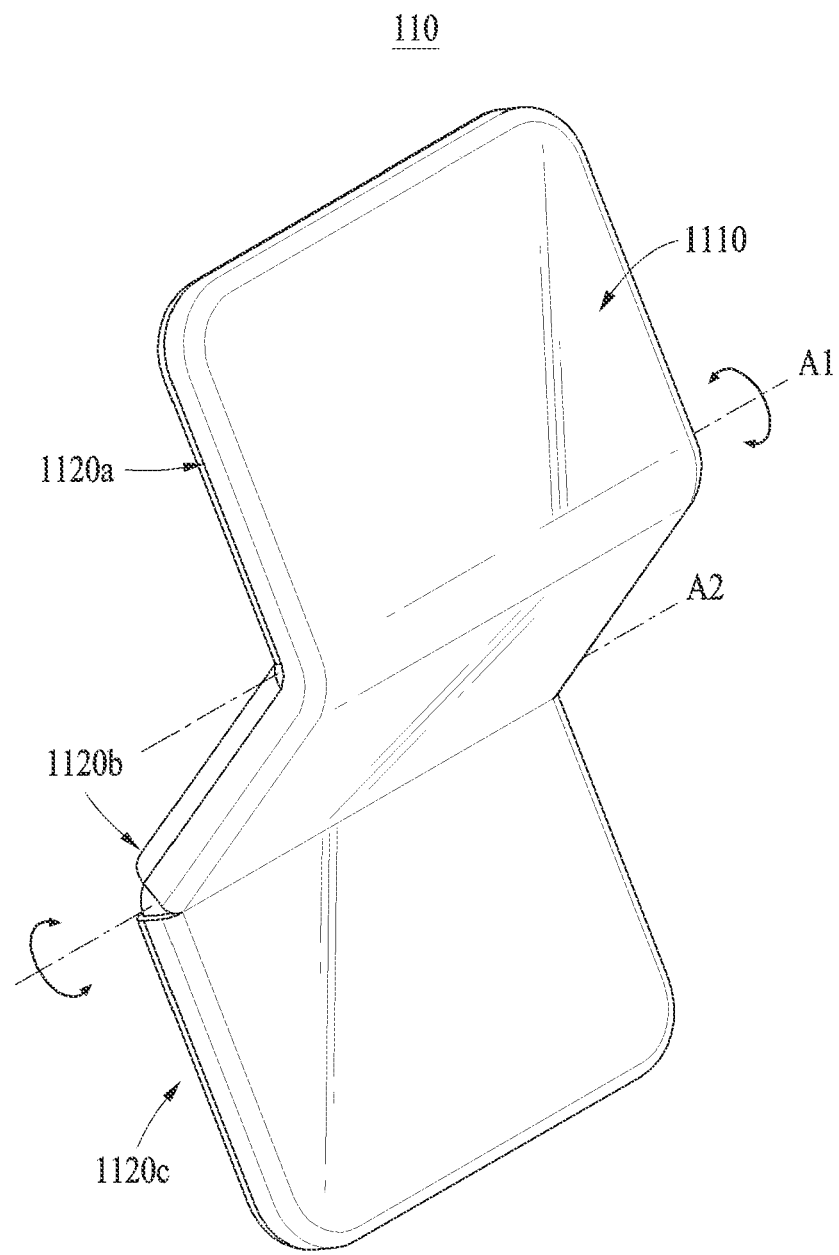
FIG. 11B is a perspective view of an electronic device in an operating state according to an embodiment of the disclosure.
Figure 11C:
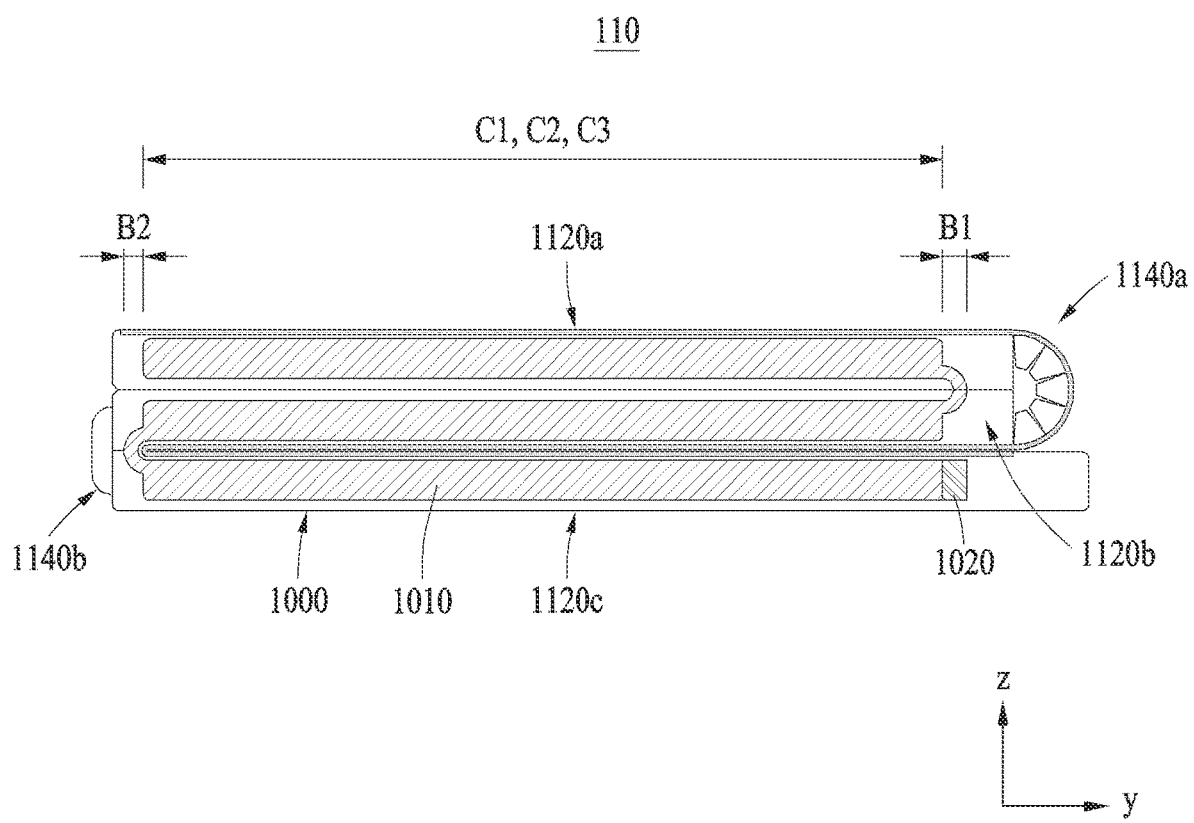
FIG. 11C is a view of a battery cell provided in an electronic device according to an embodiment of the disclosure.

FIG. 11A is a perspective view of an electronic device in an operating state according to an embodiment of the disclosure, FIG. 11B is a perspective view of an electronic device in an operating state according to an embodiment of the disclosure, and FIG. 11C is a view of a battery cell provided in an electronic device according to an embodiment of the disclosure.

Referring to FIGS. 11A and 11B, according to various embodiments, an electronic device 110 (e.g., the electronic device 101 of FIG. 1) may be folded plural times through a plurality of housings 1120a, 1120b, and 1120c and a plurality of hinge structures 1140a and 1140b connecting the housings 1120a, 1120b, and 1120c, thereby ensuring increased portability. The electronic device 110 may include the housings 1120a, 1120b, and 1120c, the hinge structures 1140a and 1140b that foldably connect the housings 1120a, 1120b, and 1120c, and a display 1110.

The housings 1120a, 1120b, and 1120c may be connected to each other to form an exterior of the electronic device 110. For example, the electronic device 110 may include a first housing 1120a, a second housing 1120b, and a third housing 1120c. The first housing 1120a, the second housing 1120b, and the third housing 1120c may form a first space 1121a, a second space 1121b, and a third space 1121c, respectively, in which components of the electronic device 110 are disposed.

The hinge structures 1140a and 1140b may foldably connect a pair of neighboring housings. For example, the electronic device 110 may include a first hinge structure 1140a that foldably connects the first housing 1120a and the second housing 1120b with respect to a first folding axis A1, and a second hinge structure that foldably connects the second housing 1120b and the third housing 1120c with respect to a second folding axis A2. The first folding axis A1 and the second folding axis A2 may be parallel to each other. As illustrated in FIG. 11B, a folding direction of the first housing 1120a and the second housing 1120b through the first folding axis A1 may be opposite to a folding direction of the second housing 1120b and the third housing 1120c through the second folding axis A2. Alternatively, the folding direction of the first housing 1120a and the second housing 1120b through the first folding axis A1 may be the same as the folding direction of the second housing 1120b and the third housing 1120c through the second folding axis A2.

The display 1110 may be disposed on a front surface of the electronic device 110. For example, the display 1110 may be disposed to cover the front of the housings 1120a, 1120b, and 1120c in an unfolded state (e.g., an unfolded state illustrated in FIG. 11A) in which the first housing 1120a, the second housing 1120b, and the third housing 1120c are unfolded. The display 1110 may be changed in shape at least partially in response to an operating state of the electronic device 110, that is, a folding state of the housings 1120a, 1120b, and 1120c. For example, the display 1110 may include a first area 1111 disposed on a front surface of the first housing 1120a, a second area 1112 disposed on a front surface of the second housing 1120b, and a third area 1113 disposed on a front surface of the third housing 1120c. The display 1110 may include a first axis area 1114 disposed between the first area 1111 and the second area 1112 and having the first folding axis A1 disposed therein, and a second axis area 1115 disposed between the second area 1112 and the third area 1113 and having the second folding axis A2 disposed therein. The display 1110 may be folded or unfolded in response to a state of the electronic device 110 as a shape of at least a portion of the first axis area 1114 or the second axis area 1115 is changed according to the state of the electronic device 110.

Referring to FIG. 11C, a battery 1000 may be disposed inside the electronic device 110. The battery 1000 may be changed in shape according to a folding operation of the electronic device 110. The battery 1000 may include a battery cell 1010, and a protection circuit portion 1020 extending from the battery cell 1010 and electrically connected to a PCB (e.g., the PCB 350 of FIG. 3) inside the electronic device 110.

The battery cell 1010 may include a plurality of cell areas C1, C2, and C3 arranged at intervals therebetween and one or more folding areas B1 and B2 that connect a pair of neighboring cell areas among the cell areas C1, C2, and C3. The battery cell 1010 may be formed as a single cell, and the number of the cell areas C1, C2, and C3 may be greater than the number of the folding areas B1 and B2 by one. For example, when the number of the cell areas C1, C2, and C3 is n (where n is an integer greater than or equal to 2), the number of the folding areas B1 and B2 may be n−1 (where n is an integer greater than or equal to 2).

The battery cell 1010 may include a first cell area C1 disposed in the first area 1111 of the first housing 1120a, a second cell area C2 disposed in the second area 1112 of the second housing 1120b, and a third cell area C3 disposed in the third area 1113 of the third housing 1120c. The battery cell 1010 may include first folding areas B1 and B2 that foldably connect the first cell area C1 and the second cell area C2, and second folding areas B1 and B2 that foldably connect the second cell area C2 and the third cell area C3. In a state in which the housings 1120a, 1120b, and 1120c of the electronic device 110 are folded to face each other as illustrated in FIG. 11C, the first cell area C1 and the second cell area C2 of the battery cell 1010 may be folded to face each other through the first folding areas B1 and B2, and the second cell area C2 and the third cell area C3 may be folded to face each other through the second folding areas B1 and B2.

Figure 12:
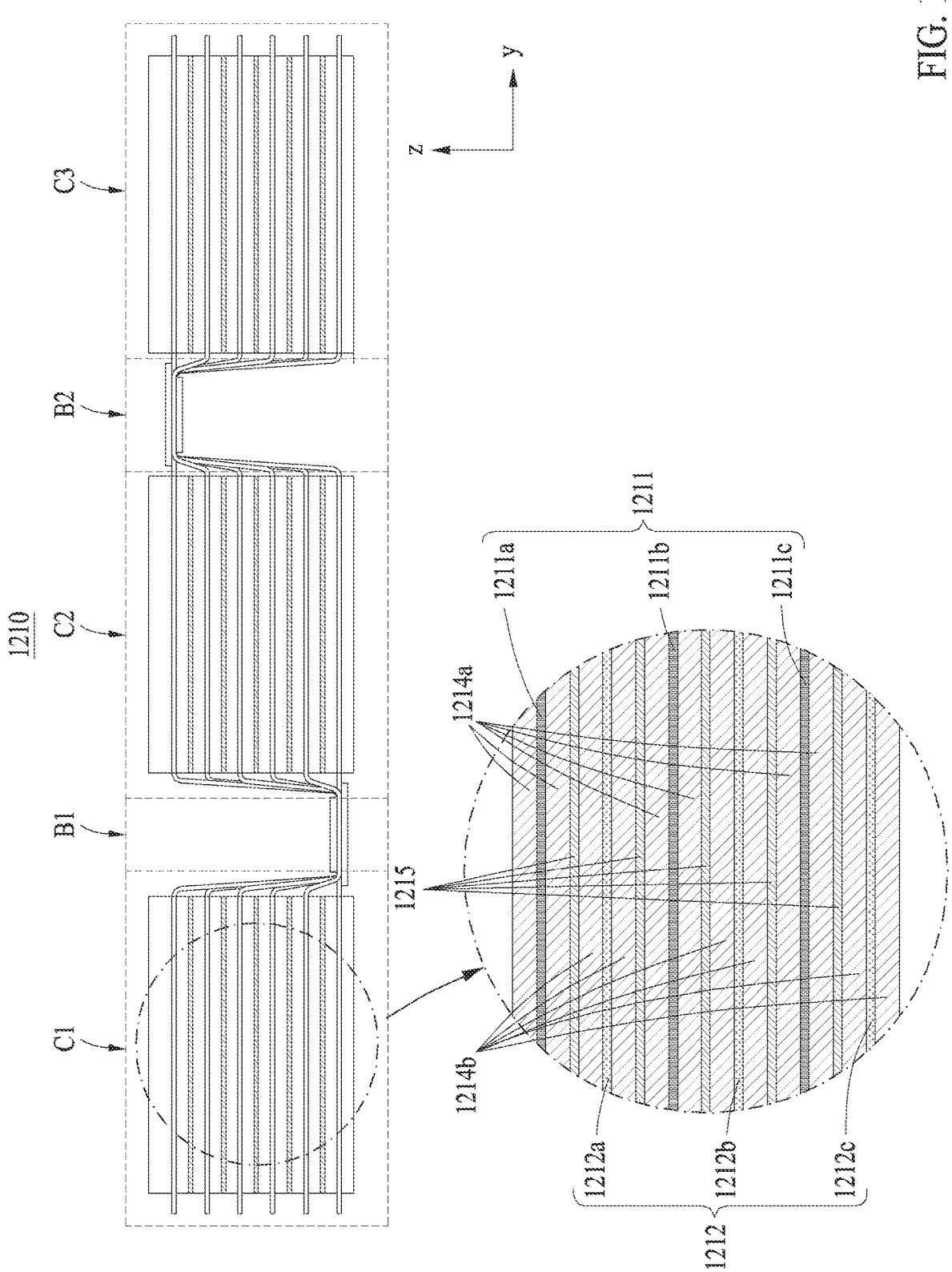
FIG. 12 is a view of a battery cell viewed from a folding axis direction according to an embodiment of the disclosure.

FIG. 12 is a view of a battery cell viewed from a folding axis direction according to an embodiment of the disclosure.

Referring to FIG. 12, according to an embodiment, a battery cell 1210 may be formed as a single cell, and include a plurality of substrate members 1211 and 1212 disposed along a longitudinal direction. The substrate member 1211 and 1212 may be disposed to pass through a plurality of cell areas C1, C2, and C3 and folding areas B1 and B2 disposed between the cell areas C1, C2, and C3. The battery cell 1210 may include a first cell area C1, a second cell area C2, and a third cell area C3 that are spaced apart from each other, and a first folding area B1 disposed between the first cell area C1 and the second cell area C2 and a second folding area B2 disposed between the second cell area C2 and the third cell area C3 The substrate member 1211 and 1212 may be disposed along the longitudinal direction extending from the first cell area C1 to the third cell area C3.

The substrate member 1211 and 1212 may include one or more positive electrode substrate member 1211a, 1211b, and 1211c, and one or more negative electrode substrate member 1212a, 1212b, and 1212c that form different electrodes. In the cell areas C1, C2, and C3, the positive electrode substrate member 1211a, 1211b, and 1211c and the negative electrode substrate member 1212a, 1212b, and 1212c may be alternately stacked in an electrically insulated state with a separation membrane 1215 disposed therebetween. Mixture layers 1214a and 1214b may be applied respectively to surfaces of the substrate member 1211 and 1212. The mixture layers 1214a and 1214b may include a positive electrode mixture layer 1214a (e.g., a positive electrode active material) applied to the surface of the positive electrode substrate member 1211a, 1211b, and 1211c, and a negative electrode mixture layer 1214b (e.g., a negative electrode active material) applied to the surface of the negative electrode substrate member 1212a, 1212b, and 1212c. The mixture layers 1214a and 1214b may be applied only to the surface of the substrate member 1211 and 1212 disposed in the cell areas C1, C2, and C3, and be omitted from the surface of the substrate member 1211 and 1212 disposed in the folding areas B1 and B2.

The battery cell 1210 may be folded through the folding areas B1 and B2, respectively. In the folding areas B1 and B2, the battery cell 1210 may form a stacked structure without a substantial overlap between the substrate member 1211 and 1212. For example, the substrate member 1211 and 1212 may be separated into arrangement areas in the folding areas B1 and B2. By this structure, the stacked structure formed by the substrate member 1211 and 1212 in the folding areas B1 and B2 may have the same thickness as that of a stacked structure formed by a single substrate portion. By this structure, the battery cell 1210 may improve flexibility of the folding areas B1 and B2 as a small (or thin) thickness is formed in the folding areas B1 and B2, and secure an electrically insulated state between the substrate member 1211 and 1212 forming opposite electrodes without a separation membrane (e.g., the separation membrane 1215).

The folding areas B1 and B2 of the battery cell 1210 may be folded with respect to respective folding axes parallel to each other. For example, the first folding area B1 may be folded with respect to a first folding axis, and the second folding area B2 may be folded with respect to a second folding axis. Respective folding directions in the folding areas B1 and B2 may be the same as or opposite to each other. Stacked structures formed respectively in the folding areas B1 and B2 by the substrate member 1211 and 1212 may be disposed to be inclined in respective folding directions of the folding areas B1 and B2. For example, when the folding directions of the first folding area B1 and the second folding area B2 are opposite to each other as illustrated in FIG. 12, the stacked structure in the first folding area B1 and the stacked structure in the second folding area B2 may be disposed to be inclined in opposite directions.

The cell areas C1, C2, and C3 may have substantially the same size or different sizes. Respective sizes of the cell areas C1, C2, and C3 may be determined based on positions of the folding areas B1 and B2 in the battery cell 1210.

According to various embodiments, an electronic device 20 may include a display 210 including a first area 211 and a second area 212, a first housing 220 connected to a lower side of the first area 211 and forming a first space 221, a second housing 230 connected to a lower side of the second area 212 and forming a second space 231, a hinge structure 343 configured to foldably connect the first housing 220 and the second housing 230 and form a first state in which the first area 211 and the second area 212 form the same plane or a second state in which the first area 211 and the second area 212 face each other, and a battery cell 510 including a first cell area C1 disposed in the first space 221, a second cell area C2 disposed in the second space 231, and a folding area B that foldably connects the first cell area C1 and the second cell area C2. The battery cell 510 may include a plurality of substrate members 611 and 612 having a longitudinal direction extending from the first cell area C1 to the second cell area C2 via the folding area B and configured to be stacked by being insulated through a separation membrane 612 in the first cell area C1 and the second cell area C1, and mixture layers 614a and 614b applied to respective surfaces of the substrate member 611 and 612 in the first cell area C1 and the second cell area C2. The folding area B may include a non-overlap stacked structure without contact between substrate member (e.g., a positive electrode substrate portion 611 or a negative electrode substrate portion 612 of FIG. 6B) forming opposite electrodes among the substrate member 611 and 612.

The substrate member 611 and 612 may be disposed while being separated such that they do not overlap each other in the folding area B.

A thickness formed by the substrate member 611 and 612 in the folding area B may be substantially the same as a thickness formed by a single substrate portion (e.g., 611a, 611b, 611c, 612a, 612b, or 612c).

A battery cell 810 may further include a reinforcing member 816 stacked on an exposed outer surface of substrate member 811 and 812 in a folding area B.

In a state in which the folding area B is folded, the reinforcing member 816 may include a first reinforcing member 816a disposed on a first surface of the substrate member 811 and 812 folded to face each other, and a second reinforcing member 816b disposed on a second surface of the substrate member 811 and 812 opposite to the first surface.

A thickness of the second reinforcing member 816b may be greater than a thickness of the first reinforcing member 816a.

The first reinforcing member 816a and the second reinforcing member 816b may each be formed of one of polyimide (PI) and UTG.

The substrate member 611a, 611b, 611c, 612a, 612b, and 612c may be arranged in parallel with the same width W2 in the folding area B.

A width W1 of one of the substrate member 611a, 611b, 611c, 612a, 612b, and 612c in the first cell area C1 or the second cell area C2 may be substantially the same as the width W2 formed by the substrate member 611a, 611b, 611c, 612a, 612b, and 612c in the folding area B.

In the folding area B, the substrate member 611a, 611b, 611c, 612a, 612b, and 612c may be arranged by being divided into both sides of an imaginary boundary line parallel to a longitudinal direction, based on an electrode formed by each substrate portion.

In a folding area B, substrate member 711 and 712 may be disposed such that the substrate member 711 and 712 forming opposite electrodes are alternately disposed along a width direction.

In a folding area B, a gap 616 may be formed between a pair of substrate member 611a and 612b forming opposite electrodes and disposed adjacent to each other.

In a folding area B, substrate member 911 and 912 may each be disposed in one of two areas separated based on an electrode formed by each substrate portion, and substrate member (e.g., any one of positive electrode substrate member 911a, 911b, and 911c, or negative electrode substrate member 912a, 912b, and 912c) forming the same electrode may be stacked while being overlapped.

A width of the substrate member 911a, 911b, 911c, 912a, 912b, and 912c in a first cell area C1 or a second cell area C2 may be substantially twice a width of the substrate member 911a, 911b, 911c, 912a, 912b, and 912c in the folding area B.

The battery cell 910 may further include a reinforcing member 916 disposed on an exposed outer surface of the substrate member 911 and 912 stacked at lowermost and uppermost ends among the substrate member 911 and 912 in the folding area B.

A first cell area C1 and a second cell area C2 may include a structure in which substrate member 1011 and 1012 are wound around winding axes X1 and X2 parallel to a folding axis A of a folding area B.

According to various embodiments, a battery 1000 may include a battery cell 1010 disposed inside an electronic device 110 and including a plurality of cell areas C1, C2, and C3 arranged at intervals therebetween and one or more folding areas B1 and B2 that foldably connect a pair of neighboring cell areas (e.g., C1 and C2 or C2 and C3), and include a protection circuit portion 1020 extending from the battery cell 1010 and electrically connected to a PCB of the electronic device 110. A battery cell 1210 may include a plurality of substrate members 1211 and 1212 having a longitudinal direction extending along a plurality of cell areas C1, C2, and C3 with one or more folding areas B1 and B2 disposed therebetween and configured to be stacked while being insulated through a separation membrane in the cell areas C1, C2, and C3, and include mixture layers 1214a and 1214b applied to respective surfaces of the substrate member 1211 and 1212. The folding areas B1 and B2 may include a stacked structure from which the mixture layers 1214a and 1214b are omitted and having no substantial overlap area between the substrate member 1211 and 1212.

The battery cell 1210 may further include a reinforcing member disposed on at least one surface of exposed surfaces of the substrate member 1211 and 1212 in the folding areas B1 and B2 and formed of one of polyimide (PI) and UTG.

In a state in which a folding area B is folded, a reinforcing member 916 may include a first reinforcing member 916a disposed on a first surface of the substrate member 911 and 912 folded to face each other, and a second reinforcing member 916b disposed on a second surface opposite to the first surface and having a thickness greater than that of the first reinforcing member 916a.

A folding area may be provided as a plurality of folding areas, for example, folding areas B1 and B2, and the folding areas B1 and B2 may be folded with respect to folding axes A and A2, respectively.

The cell areas C1, C2, and C3 may have substantially the same size or different sizes.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
    a display comprising a first area and a second area disposed on a front surface of the display;
    a first housing connected to a rear surface of the first area and forming a first space;
    a second housing connected to a rear surface of the second area and forming a second space;
    a hinge structure configured to foldably connect the first housing and the second housing with respect to a folding axis and allow the first area and the second area to be in a first state in which the first area and the second area form a same plane or a second state in which the first area and the second area face each other; and
    a battery cell comprising a first cell area disposed in the first space, a second cell area disposed in the second space, and a folding area that foldably connects the first cell area and the second cell area,
    wherein the battery cell comprises:
        a plurality of substrate members having a longitudinal direction extending from the first cell area to the second cell area through the folding area, and stacked while being insulated through a separation membrane in the first cell area and the second cell area, and
        a mixture layer applied to a surface of each substrate member of the plurality of substrate members in the first cell area and the second cell area,
    wherein each substrate member of the plurality of substrate members in the folding area has a smaller width than the first cell area and the second cell area,
    wherein the plurality of substrate members is arranged by being separated from each other so as not to overlap each other in the folding area, each substrate member of the plurality of substrate members is arranged side by side along a width direction in the folding area separated from each other to avoid overlapping, and disposed at substantially the same height to form a stacked structure of a single substrate layer, and
    wherein the stacked structure formed by the plurality of substrate members in the folding area is disposed to be inclined in a direction in which the first cell area and the second cell area of the battery cell are folded to face each other in a view of the width direction.

2. The electronic device of claim 1, wherein the plurality of substrate members are arranged in parallel to each other with the same width in the folding area.

3. The electronic device of claim 2, wherein a width of one substrate portion in the first cell area or the second cell area is substantially the same as a width formed by the substrate member in the folding area.

4. The electronic device of claim 1, wherein, in the folding area, the plurality of substrate members are arranged by being divided into both sides of an imaginary boundary line parallel to a longitudinal direction, according to an electrode formed by each of the substrate member.

5. The electronic device of claim 1, wherein, in the folding area, a gap is formed between a pair of substrate member forming opposite electrodes and disposed adjacent to each other.

* * * * *